US012739968B2

(12) United States Patent
Fujii

(10) Patent No.: US 12,739,968 B2
(45) Date of Patent: Sep. 15, 2026

(54) MULTILAYER DIELECTRIC SUBSTRATE AND METHOD FOR MANUFACTURING MULTILAYER DIELECTRIC SUBSTRATE

(71) Applicant: Murata Manufacturing Co., Ltd., Nagaokakyo (JP)

(72) Inventor: Norikazu Fujii, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 766 days.

(21) Appl. No.: 18/167,908

(22) Filed: Feb. 13, 2023

(65) Prior Publication Data

US 2023/0209730 A1 Jun. 29, 2023

Related U.S. Application Data

(63) Continuation of application No. PCT/JP2021/021698, filed on Jun. 8, 2021.

(30) Foreign Application Priority Data

Aug. 13, 2020 (JP) ................................ 2020-136778

(51) Int. Cl.
*H05K 1/02* (2006.01)
*H01P 1/203* (2006.01)
(Continued)

(52) U.S. Cl.
CPC ........... *H05K 1/0243* (2013.01); *H01P 1/203* (2013.01); *H01Q 1/2283* (2013.01); *H05K 1/03* (2013.01); *H05K 3/4697* (2013.01); *H01Q 1/22* (2013.01); *H05K 2201/0183* (2013.01); *H05K 2201/10098* (2013.01)

(58) Field of Classification Search
CPC .................. H05K 3/4697; H05K 1/03; H05K 2201/0183; H05K 3/4614; H05K 3/4629; H05K 2201/10098; H05K 2203/061; H05K 1/0243; H01P 1/203; H01Q 1/22; H01Q 1/2283; H01Q 9/0414; H01Q 9/0407
See application file for complete search history.

(56) References Cited

U.S. PATENT DOCUMENTS 6,903,700 B2 * 6/2005 Maruhashi ............ H01Q 13/10 343/770
7,728,774 B2 * 6/2010 Akkermans .......... H01Q 9/0457 343/893
(Continued)

FOREIGN PATENT DOCUMENTS

JP 2006-229871 A 8/2006
JP 2012-69954 A 4/2012
(Continued)

OTHER PUBLICATIONS

International Search Report and Written Opinion mailed on Aug. 24, 2021, received for PCT Application PCT/JP2021/021698, filed on Jun. 8, 2021, 9 pages including English Translation.

*Primary Examiner* — Steven T Sawyer
(74) *Attorney, Agent, or Firm* — XSENSUS LLP

(57) ABSTRACT

A method includes after application of a bonding material, such as a metal paste, on a second dielectric substrate, a first dielectric substrate with a recess formed therein is laminated on the second dielectric substrate. Thereafter, the bonding material is sintered to form a cavity inside the dielectric substrate.

18 Claims, 16 Drawing Sheets

(51) Int. Cl.

| | |
|---|---|
| ***H01Q 1/22*** | (2006.01) |
| ***H05K 1/03*** | (2006.01) |
| ***H05K 3/46*** | (2006.01) |

(56) References Cited

U.S. PATENT DOCUMENTS

| | | | | |
|---|---|---|---|---|
| 9,172,132 | B2 * | 10/2015 | Kam | H01Q 1/2283 |
| 10,840,578 | B2 * | 11/2020 | Yu | H01Q 21/0087 |
| 11,075,453 | B1 * | 7/2021 | Bulumulla | H01Q 1/422 |
| 11,637,381 | B2 * | 4/2023 | Chang | H01Q 1/2208 343/700 R |
| 2010/0001906 | A1 * | 1/2010 | Akkermans | H01Q 9/0457 343/770 |
| 2010/0327068 | A1 * | 12/2010 | Chen | H01Q 1/2283 235/492 |
| 2016/0049723 | A1 * | 2/2016 | Baks | H01Q 1/48 343/848 |
| 2019/0252772 | A1 * | 8/2019 | Ndip | H01Q 1/02 |
| 2019/0334231 | A1 * | 10/2019 | Sakurai | H01Q 1/38 |
| 2019/0363432 | A1 * | 11/2019 | Hayashi | B32B 3/266 |
| 2020/0161766 | A1 * | 5/2020 | Liu | H01Q 9/045 |

FOREIGN PATENT DOCUMENTS

| | | | |
|---|---|---|---|
| JP | 2018-26717 | A | 2/2018 |
| JP | 2018-137737 | A | 8/2018 |
| WO | 2019/167894 | A1 | 9/2019 |
| WO | 2020/158212 | A1 | 8/2020 |

* cited by examiner

POLARIZATION DIRECTION
100
SP1
120
20
161
II
Y
Z
X
140e
140c
15
140a
50
140b
162
RFIC
10
GND
140d
160

FIG.2

| | NO CAVITY | CAVITY STRUCTURE 1 | CAVITY STRUCTURE 2 |
|---|---|---|---|
| PLAN VIEW | SP1 120 300 | 20 20 20 20 SP1 120 200 | 20 20 SP1 120 100 |
| BAND WIDTH (DIFFERENCE) | 1.553GHz | 1.641GHz (+90MHz) | 1.633GHz (+80MHz) |
| GAIN (DIFFERENCE) | 5.02dBi | 5.48dBi (+0.46dB) | 5.45dBi (+0.43dB) |

RETURN LOSS (dB)
GAIN (dB)
CAVITY STRUCTURE 1
CAVITY STRUCTURE 2
1.641GHz
1.553GHz
1.633GHz
1.553GHz
3001
2001
1001
Freq[GHz]
26.0 26.5 27.0 27.5 28.0 28.5 29.0 29.5 30.0
0 5 6 10 15 20
Peak Gain
Gain[dBi]
8 6 4 2 0 −2
−90 −60 −30 0 30 60 90
degree
2002
1002
3002
CAVITY NOT PRESENT
CAVITY PRESENT
CAVITY PRESENT (PATCH END)

115
150
120
161
120
150
120
161
120
III
III
162
Z
Y
X 115
161
162
140c
140d
140e
140a
140b
120
SP1
15
20
50
GND
10
RFIC
Z
Y
X 116
161
162
50
120
20
Z
Y
X 116
161
162
50
120
20
Z
Y
X

FIG.21

MULTILAYER DIELECTRIC SUBSTRATE AND METHOD FOR MANUFACTURING MULTILAYER DIELECTRIC SUBSTRATE

CROSS REFERENCE TO RELATED APPLICATIONS

The present application is a continuation application of International Patent Application No. PCT/JP2021/021698, filed Jun. 8, 2021, which claims priority to Japanese Patent Application No. 2020-136778, filed Aug. 13, 2020, the entire contents of each of which being incorporated herein by reference.

TECHNICAL FIELD

The present disclosure relates to a multilayer dielectric substrate and a method for manufacturing the multilayer dielectric substrate, and more specifically to a multilayer dielectric substrate for constituting a radio frequency (RF) circuit such as a millimeter wave circuit and a method for manufacturing the multilayer dielectric substrate.

BACKGROUND ART

Japanese Unexamined Patent Application Publication No. 2018-26717 (Patent Document 1) discloses a co-fired ceramic substrate with a hollow space formed between a radiation conductor and a ground conductor, and a method for manufacturing the same.

The method for manufacturing the co-fired ceramic substrate disclosed in Patent Document 1 includes: a step of preparing a ceramic green sheet on which a conductive paste pattern of a radiation conductor is disposed, a ceramic green sheet in which a through opening corresponding to a hollow space is formed, a ceramic green sheet on which a conductive paste pattern of a ground conductor is disposed, and a ceramic green sheet on which a conductive paste pattern for a wiring line and a passive component paste pattern is disposed; a step of obtaining a green sheet multilayer body; and a step of causing the green sheet multilayer body to be sintered.

In the manufacturing method disclosed in Patent Document 1, the through opening is filled with a paste containing particles made of organic resin and then the respective ceramic green sheets are laminated, and thereafter the green sheet multilayer body is heated to remove organic components contained in the green sheet multilayer body. As a result, a hollow space is produced in the portion of the through opening from which the paste has been removed. The radiation conductor, a first portion of the multilayer ceramic body including the hollow space, and the ground conductor constitute a planar antenna.

According to Patent Document 1, since the planar antenna has the hollow space, loss by the dielectric is suppressed and therefore high radiation efficiency can be achieved.

CITATION LIST

Patent Document

Patent Document 1: Japanese Unexamined Patent Application Publication No. 2018-26717

SUMMARY

Technical Problems

Among other things, the manufacturing method described in Patent Document 1 needs a step of preventing deformation of the through opening by the through opening being filled with the paste prior to laminating the ceramic green sheet with the through opening formed therein on the other ceramic green sheets. In addition, unless the paste is filled to be flush with the through opening, the through opening may be deformed in the laminating step or the firing step, thereby raising a risk that the initially assumed hollow space is not formed.

The present disclosure has been constructed to solve such a problem, as well as other problems, and so one non-limiting aspect of the present disclosure is to implement a method for forming a hollow space in a multilayer dielectric substrate without requiring a through opening to be filled with a paste.

Solutions to Problems

According to one, non-limiting, aspect of the present disclosure, there is provided a method for manufacturing a multilayer dielectric substrate. The method includes after application of a bonding material, such as a metal paste, on a second dielectric substrate, a first dielectric substrate with a recess formed therein is laminated on the second dielectric substrate. Thereafter, the bonding material is sintered to form a cavity inside the dielectric substrate.

Advantageous Effects of Disclosure

According to an aspect of the present disclosure, a hollow space may be formed in a multilayer dielectric substrate without requiring a through opening to be filled with a paste.

BRIEF DESCRIPTION OF DRAWINGS

FIG. 2 is a table comparing simulation results of characteristics of two antenna modules each having a cavity structure and those of antenna modules without cavity structure.

FIG. 4 is a diagram explaining an example of a manufacturing process of the antenna module in FIG. 1.

FIG. 21 is a diagram illustrating an example in which a radiation electrode 120 is additionally disposed above a radiation electrode 120 of Embodiment 3 illustrated in FIG. 16.

DESCRIPTION OF EMBODIMENTS

Figure 1:
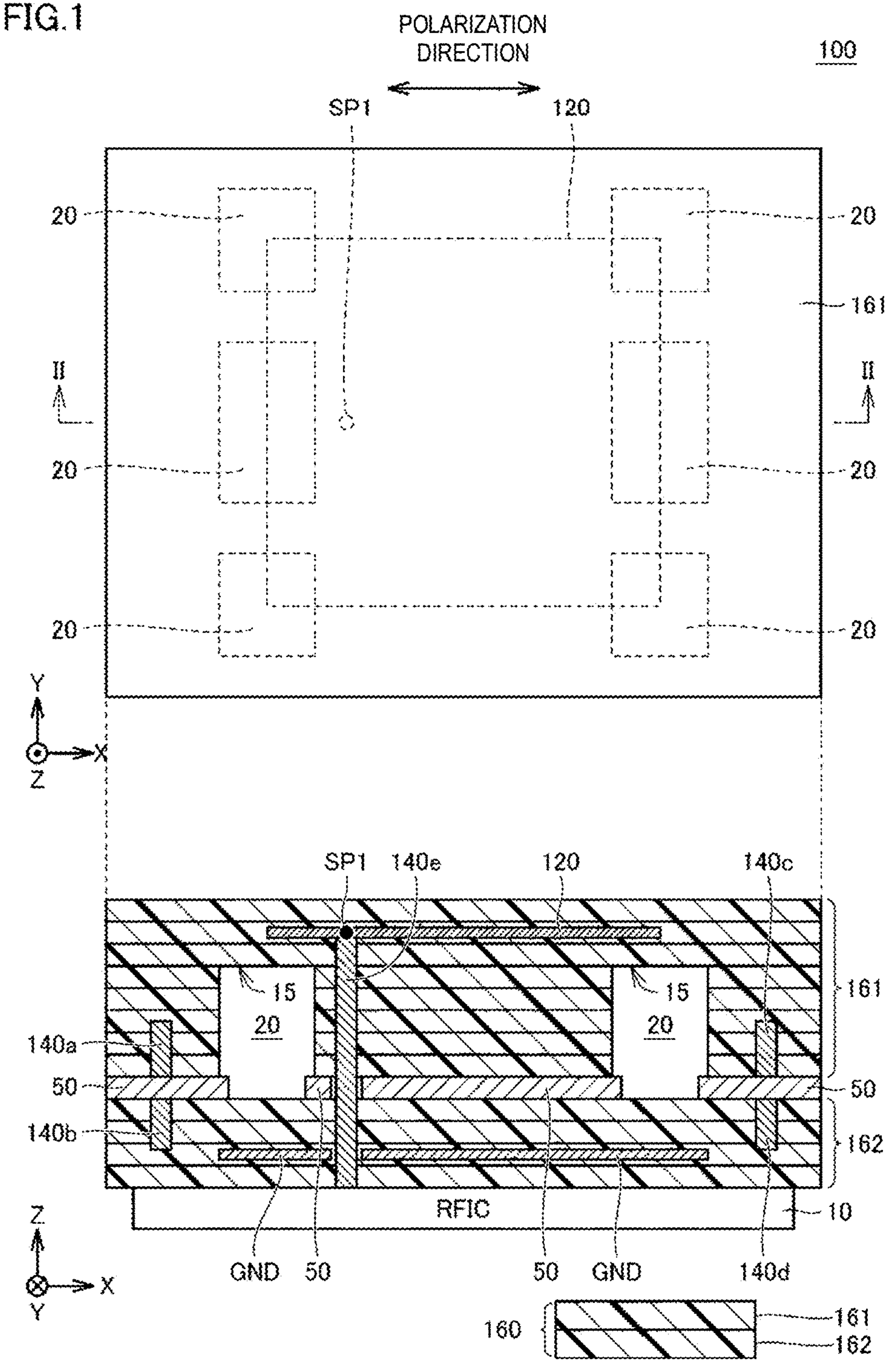
FIG. 1 includes a transparent plan view and a transparent cross-sectional view of an antenna module according to Embodiment 1.

Hereinafter, embodiments of the present disclosure will be described in detail with reference to the drawings. Note that the same or corresponding portions in the drawings are denoted by the same reference sign and description thereof will not be repeated.

Embodiment 1

Structure of Antenna Module

FIG. 1 includes a transparent plan view (upper stage) and a cross-sectional view (lower stage) of an antenna module 100 according to Embodiment 1. The cross-sectional view on the lower stage is a transparent cross-sectional view taken along a plane II-II passing through a feed point SP1 of a radiation electrode 120 serving as a feed element in the plan view. In the following description, a positive direction of a Z axis in FIG. 1 may be referred to as an upper surface side, and a negative direction thereof may be referred to as a lower surface side.

As illustrated in the transparent cross-sectional view of FIG. 1, the antenna module 100 has a structure in which a first dielectric substrate 161 and a second dielectric substrate 162 are laminated, and a dielectric substrate 160 as an example of a multilayer dielectric substrate is formed by the two dielectric substrates 161 and 162. The antenna module 100 includes the dielectric substrate 160, the radiation electrode 120, a ground electrode GND, and a RF integrated circuit (RFIC) 10. There are formed vias 140*a* to 140*e* in the dielectric substrate 160. The vias 140*a* to 140*e* are filled with a conductive paste before the first dielectric substrate 161 and the second dielectric substrate 162 are fired.

The dielectric substrate 160 has a substantially rectangular shape when the antenna module 100 is seen in a plan view from the normal direction of the substrate (a Z-axis direction in the drawing). The RFIC 10 is mounted on one principal surface (lower surface) of the dielectric substrate 160.

The ground electrode GND is disposed in a layer near the lower surface of the dielectric substrate 160. The radiation electrode 120 having a substantially rectangular shape is disposed in a layer near the other principal surface (upper surface) of the dielectric substrate 160. The ground electrode GND may be extended to an end of the dielectric substrate 160 in an X-axis direction.

The radiation electrode 120 and the RFIC 10 are electrically connected to each other through a feeder formed inside the via 140*e*. The feeder passes through the ground electrode GND to connect to the feed point SP1 of the radiation electrode 120. The feed point SP1 is disposed at a position offset from the center of the radiation electrode 120 toward one of the two sides parallel to a Y axis in the radiation electrode 120. Accordingly, a radio wave whose polarization direction is along the X-axis direction is radiated from the radiation electrode 120.

The first dielectric substrate 161 and the second dielectric substrate 162 each have a multilayer structure in which a plurality of dielectric layers is laminated. Each of the first dielectric substrate 161 and the second dielectric substrate 162 is, for example, a low temperature co-fired ceramics (LTCC) multilayer substrate, a multilayer resin substrate formed by laminating a plurality of resin layers each made of a resin such as epoxy or polyimide, a multilayer resin substrate formed by laminating a plurality of resin layers each made of a liquid crystal polymer (LCP) having a lower dielectric constant, a multilayer resin substrate formed by laminating a plurality of resin layers each made of a fluororesin, a multilayer resin substrate formed by laminating a plurality of resin layers each made of a polyethylene terephthalate (PET) material, or a ceramics multilayer substrate other than the LTCC. It is not absolutely necessary for the first dielectric substrate 161 and the second dielectric substrate 162 to have a multilayer structure, and they may be a single-layer substrate.

A recess 15 (which later will become part of a cavity) is formed in the first dielectric substrate 161 by cutting out part of the bottom surface in a direction toward the upper surface. The bottom surface of the first dielectric substrate 161 and the upper surface of the second dielectric substrate 162 are bonded by a bonding material 50. Part of the bonding material 50 located on a bonding surface between the first dielectric substrate 161 and the second dielectric substrate 162 is exposed to the recess 15 side. The bonding material 50 is, for example, a conductive metal paste such as a copper paste. The bonding material 50 may be solder. Alternatively, the bonding material 50 may be a non-conductive paste (other than ceramic) such as a resin adhesive or varnish.

The vias 140*a* and 140*c* in contact with the bonding material 50 are formed in the first dielectric substrate 161. The vias 140*b* and 140*d* in contact with the bonding material 50 in the second dielectric substrate 162. The via 140*a* and the via 140*b* are in contact with the bonding material 50 so as to "pinch", or sandwich, the bonding material 50 from above and below. The via 140*c* and the via 140*d* are in contact with the bonding material 50 and also pinch, or sandwich, the bonding material 50 from above and below.

These vias 140*a* to 140*d* are provided like piles that are driven into the bonding material 50 and the first dielectric substrate 161 and second dielectric substrate 162 located above and below the bonding material 50, respectively. When the conductive paste filled into each of the vias 140*a* to 140*d* is sintered, the first dielectric substrate 161 and the second dielectric substrate 162 are more firmly bonded to each other at the bonding surface of both the substrates.

In a state where the bottom surface of the first dielectric substrate 161 and the upper surface of the second dielectric substrate 162 are bonded to each other, a cavity 20 is formed in the portion of the recess 15. The dielectric substrate 160 includes a layer on the upper surface side relative to the cavity 20, and the radiation electrode 120 is disposed in this layer. The cavity 20 is located between the radiation electrode 120 and the ground electrode GND. As illustrated in the transparent plan view, when the antenna module 100 is viewed from above, a total of six cavities 20 are formed at positions along two sides parallel to the Y-axis direction among the four sides of the radiation electrode 120 having a substantially rectangular shape. In other words, the cavities 20 are formed along two sides orthogonal to the polarization direction of the radio wave radiated from the radiation electrode 120 among the four sides of the radiation electrode 120. Hereinafter, the reason why the cavities 20 are formed along the two sides orthogonal to the polarization direction of the radio wave radiated from the radiation electrode 120 among the four sides of the radiation electrode 120 will be described.

The frequency bandwidth of a radio wave that can be radiated from the radiation electrode 120 is determined by the strength of electromagnetic field coupling between the radiation electrode and the ground electrode. The frequency bandwidth becomes narrower as the strength of the electromagnetic field coupling becomes stronger, and the frequency bandwidth becomes wider as the strength of the electromagnetic field coupling becomes weaker.

In general, in order to expand the frequency bandwidth of the radio wave radiated from the radiation electrode, it is necessary to increase the thickness of the dielectric substrate. On the other hand, a communication device such as a smartphone to which an antenna module is applied is required to be reduced in size and thickness. Therefore, when the thickness of the dielectric substrate is increased, the thickness increase may suppress the reduction in size and the reduction in thickness of the device.

The strength of the electromagnetic field coupling is also affected by the effective dielectric constant between two electrodes. More specifically, when the effective dielectric constant is high, the electromagnetic field coupling becomes strong, and when the effective dielectric constant is low, the electromagnetic field coupling becomes weak. That is, by reducing the effective dielectric constant between the two electrodes, the frequency bandwidth may be expanded.

In order to reduce the effective dielectric constant between the radiation electrode and the ground electrode, it is effective to form a hollow space between the radiation electrode and the ground electrode. Specifically, in the dielectric substrate, it is effective that a region through which lines of electric force running between the radiation electrode and the ground electrode pass is made to be hollow. This is because the dielectric constant of air is lower than the dielectric constant of the dielectric forming the dielectric substrate 160. However, in consideration of the overall strength of the dielectric substrate 160, it is needed to devise the size, position, and the like of the hollow space.

The density of the lines of electric force between the radiation electrode and the ground electrode is highest at an electrode end of the radiation electrode orthogonal to the polarization direction of the radio wave. Accordingly, it is effective to lower the dielectric constant between the radiation electrode and the ground electrode in a site where the density of the lines of electric force is high, that is, in a site extending in a direction orthogonal to the polarization direction of the radio wave and located near the electrode end.

Thus, in the antenna module 100 of Embodiment 1, as described above, the cavities 20 are formed along the two sides orthogonal to the polarization direction of the radio wave radiated from the radiation electrode 120 among the four sides of the radiation electrode 120. By forming the cavities 20, the effective dielectric constant between the radiation electrode 120 and the ground electrode GND may be reduced. As a result, in the antenna module 100 of Embodiment 1, the frequency bandwidth may be widened without increasing the size of the overall module.

Since the loss of electric energy in the dielectric may be reduced by forming the cavities 20, the efficiency of the antenna module may be improved. The sizes in the X-axis and Y-axis directions of the first dielectric substrate 161 and the second dielectric substrate 162 may be different. The side surface of the first dielectric substrate 161, in which the recess 15 is formed, is allowed to be nonlinear. For example, the side surface of the first dielectric substrate 161 may be formed stepwise by providing a step on the side surface thereof.

An antenna circuit is constituted by the antenna module 100 including the radiation electrode 120, the ground electrode GND, and the RFIC 10. The antenna circuit is an example of a radio frequency circuit.

Simulation Result

Figure 3:
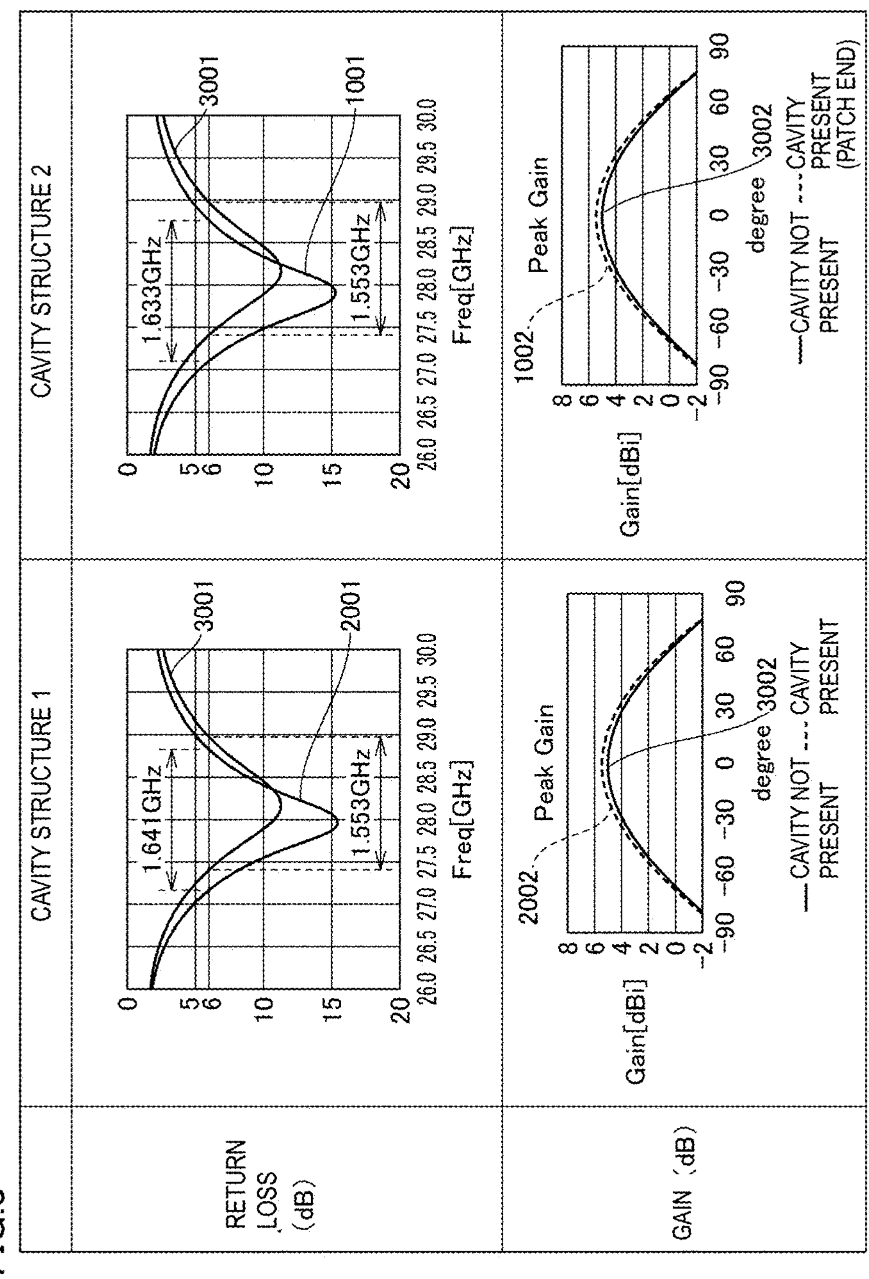
FIG. 3 is a diagram for explaining comparison of antenna characteristics of antenna modules.

FIG. 2 and FIG. 3 depict a simulation result in which antenna characteristics of two antenna modules 100 and 200 each having a cavity structure are compared with antenna characteristics of an antenna module 300 having no cavity structure.

In FIG. 2, a perspective plan view (upper row), a bandwidth (middle row), and gain (lower row) of each antenna module are depicted. In FIG. 3, return loss (upper row) and gain (lower row) of each antenna module are depicted.

In the following simulation, an example in which a frequency band to be used is a millimeter wave frequency band (GHz band) will be described, but the configuration of the present disclosure is also applicable to a frequency band other than the millimeter wave.

Referring to FIG. 2, the antenna modules 100 and 200 are each an example of an antenna module having a cavity structure. The antenna module 300 is an example of an antenna module not having a cavity structure. The antenna module corresponding to "cavity structure 2" in FIG. 2 is the antenna module 100 of Embodiment 1. The antenna module 200 corresponding to "cavity structure 1" in FIG. 2 is one of variations of Embodiment 1.

The cavity 20 is not formed in the antenna module 300 corresponding to "no cavity". The cavities 20 are formed along four sides of the radiation electrode 120 having a substantially rectangular shape in the antenna module 200 corresponding to "cavity structure 1". In the antenna module 200, the cavity 20 is additionally formed near the center of the radiation electrode 120. As described above, the cavities 20 are formed along the two sides orthogonal to the polarization direction of the radio wave radiated from the radiation electrode 120 in the antenna module 100 corresponding to "cavity structure 2".

Referring to FIG. 2, the bandwidth of the antenna module 100 is 1.633 GHz, and the bandwidth of the antenna module 200 is 1.641 GHz. These bandwidths are wider than the bandwidth 1.553 GHz of the antenna module 300 with no cavity structure by at least 80 MHz or more.

A comparative example of return loss 2001 of the antenna module 200 and return loss 3001 of the antenna module 300 is depicted in the upper row of "cavity structure 1" of FIG. 3. A comparative example of return loss 1001 of the antenna module 100 and return loss 3001 of the antenna module 300 is depicted in the upper row of "cavity structure 2" of FIG. 3. The values of the bandwidths depicted in FIG. 2 are calculated based on the frequency band in which the return loss of 6 dB can be secured in FIG. 3.

Referring to FIG. 2, the gain of the antenna module 100 is 5.45 dBi, and the gain of the antenna module 200 is 5.48 dBi. These gains are higher by at least 0.43 dBi or more than the gain 5.02 dBi of the antenna module 300 with no cavity structure.

In the lower row of "cavity structure 1" of FIG. 3, a comparative example of gain 2002 of the antenna module 200 and gain 3002 of the antenna module 300 is depicted. In the lower row of "cavity structure 2" of FIG. 3, a comparative example of gain 1002 of the antenna module 100 and gain 3002 of the antenna module 300 is depicted. The gain values depicted in FIG. 2 are calculated based on the gain graphs in FIG. 3.

As described above, the antenna modules 100 and 200 having the cavity structure have a wider frequency bandwidth and a higher gain than the antenna module 300 having no cavity structure. On the other hand, when the antenna module 100 and the antenna module 200 are compared with each other, a difference in frequency bandwidth and a difference in gain between them are very small as compared to a difference in frequency bandwidth and a difference in gain between the antenna modules 100, 200 and the antenna module 300. This means that the provision of the cavities 20 along the two sides orthogonal to the polarization direction of the radio wave is effective for improving the antenna performance.

While the antenna performance may be improved by providing the cavities 20 at appropriate locations in the dielectric substrate, the cavities 20 may weaken the strength of the dielectric substrate depending on a way in which the cavities 20 are provided. In a case where a large number of cavities 20 are provided in the dielectric substrate, the substrate structure becomes complicated, and as a result, there arises a risk that the manufacturing process of the antenna module also becomes complicated. Furthermore, the cavity 20 provided near the feed point SP1 of the radiation electrode 120 may restrict the route design of a feeding path extending from the feed point SP1 toward the RFIC 10 through the laminated portion of the dielectric substrate.

Therefore, in the production of the antenna module, it is desirable to provide the cavities 20 at the locations effective for improving the antenna performance while suppressing, as much as possible, the sizes of the spaces formed inside the dielectric substrate by the cavities 20. In this respect, the antenna module 100 is superior to the antenna module 200. Note that, however, in the present disclosure, the antenna module 200 is not excluded from the scope of Embodiment 1.

Manufacturing Process

Next, a manufacturing process of the antenna module according to Embodiment 1 will be described with reference to FIG. 4. In the following description, the case of the antenna module 100 illustrated in FIG. 1 will be described as an example.

Figure 4:
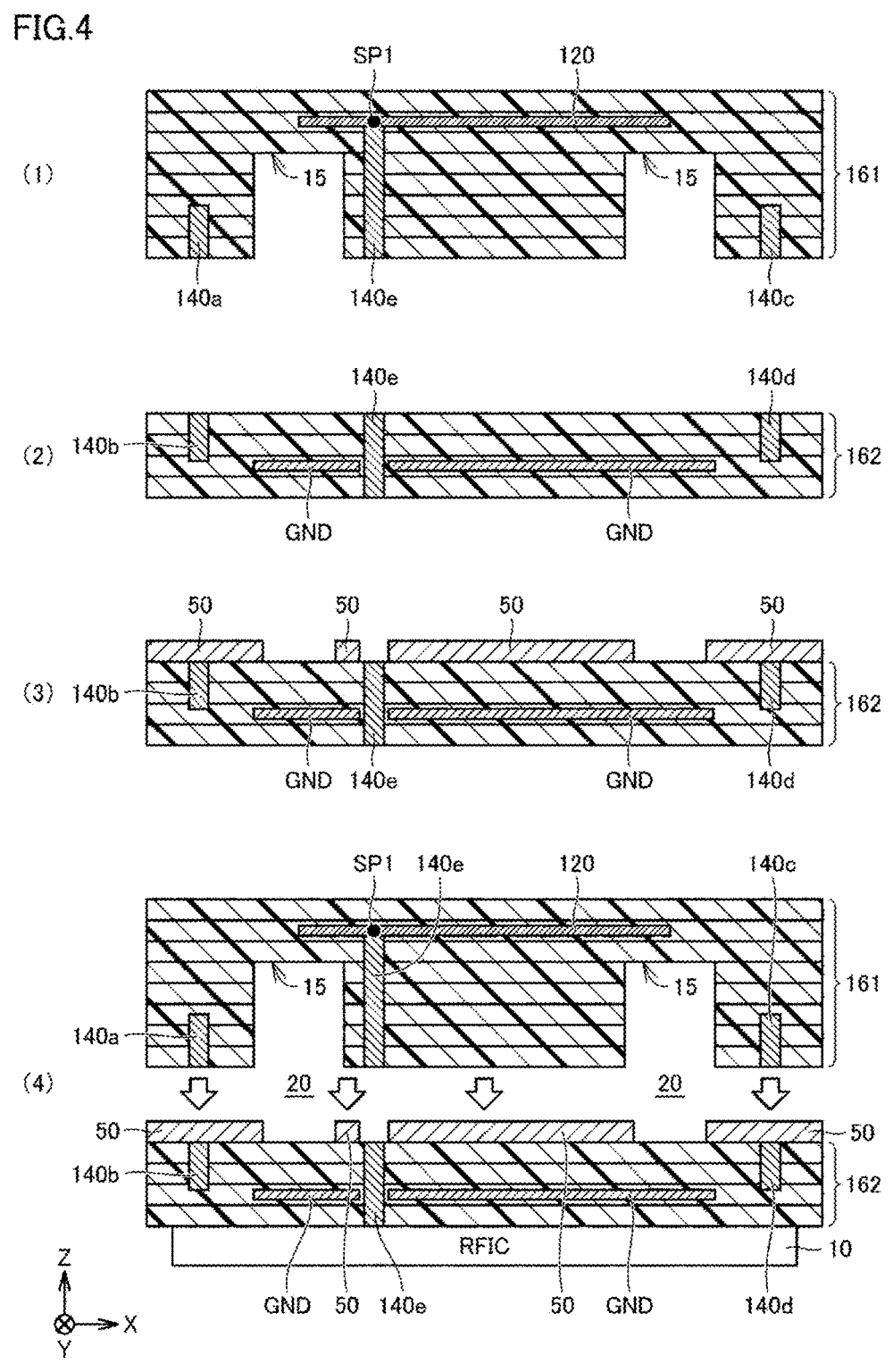

FIG. 4 is a diagram explaining an example of the manufacturing process of the antenna module 100 in FIG. 1.

(1) First Dielectric Substrate

First, the first dielectric substrate 161 illustrated in FIG. 4, part (1) is prepared. The first dielectric substrate 161 is formed by laminating photosensitive ceramic green sheets. The first dielectric substrate 161 includes a layer in which the radiation electrode 120 is disposed, the via 140*e* extending toward the feed point SP1 of the radiation electrode 120, and the vias 140*a* and 140*c* at end portions. The vias 140*a*, 140*c*, and 140*e* are formed in the first dielectric substrate 161 by laser processing or machining.

The recesses 15 are formed, after the ceramic green sheets are laminated, by removing the corresponding portions by laser processing or machining. The ceramic is sintered by causing the multilayer body in which the recesses 15 are formed to be sintered. As a result, the first dielectric substrate 161 is obtained. After the first dielectric substrate 161 is sintered, the vias 140*a*, 140*c*, and 140*e* are filled with a conductive paste. The portion corresponding to the recess 15 may be cut out every time one ceramic green sheet is laminated. Alternatively, the recesses 15 may be formed by laser processing or machining after firing the laminated ceramic green sheets.

(2) Second Dielectric Substrate

Subsequently, the second dielectric substrate 162 illustrated in FIG. 4, part (2) is prepared. The second dielectric substrate 162 is formed by laminating photosensitive ceramic green sheets. The second dielectric substrate 162 includes a layer in which the ground electrode GND is disposed, and vias 140*b*, 140*d*, and 140*e* respectively corresponding to the vias 140*a*, 140*c*, and 140*e* formed in the first dielectric substrate 161. The vias 140*b*, 140*d*, and 140*e* are formed by laser processing or machining. Thereafter, the multilayer body is sintered to obtain the second dielectric substrate 162. After the second dielectric substrate 162 is sintered, the vias 140*b*, 140*d*, and 140*e* are filled with a conductive paste.

(3) Application of Bonding Material to Second Dielectric Substrate

Subsequently, as illustrated in FIG. 4, part (3), of the second dielectric substrate 162, a portion to which the first dielectric substrate 161 is to be bonded is applied with the bonding material 50. The bonding material 50 is, for example, a metal paste such as a copper paste. Of the first dielectric substrate 161, a portion to which the second dielectric substrate 162 is to be bonded may be applied with the bonding material 50. Alternatively, the bonding material 50 may be applied to both the first dielectric substrate 161 and the second dielectric substrate 162, and then both the substrates may be laminated.

(4) Bonding of First Dielectric Substrate and Second Dielectric Substrate

Subsequently, as illustrated in FIG. 4, part (4), the first dielectric substrate 161 and the second dielectric substrate 162 are arranged with the bonding material 50 interposed therebetween so that the recess 15 is present between the radiation electrode 120 on the first dielectric substrate 161 side and the ground electrode GND on the second dielectric substrate 162 side. Thus, the cavity 20 is formed between the radiation electrode 120 and the ground electrode GND.

Thereafter, the first dielectric substrate 161 and the second dielectric substrate 162 arranged with the bonding material 50 interposed therebetween are fired. As a result, metal particles of the metal paste as an example of the bonding material 50 are sintered together, and consequently the first dielectric substrate 161 and the second dielectric substrate 162 are bonded. By firing the first dielectric substrate 161 and the second dielectric substrate 162, the conductive paste filled into the vias 140*a* to 140*e* is also sintered. When the conductive paste filled into the via 140*e* is sintered, a feeder is constituted inside the via 140*e*.

The conductive paste filled into the vias 140*a* and 140*b* and the conductive paste filled into the vias 140*c* and 140*d* each come into contact with the bonding material 50 in the form of pinching the bonding material 50 in the Z-axis direction, and are sintered. With this, the first dielectric substrate 161 and the second dielectric substrate 162 are more firmly bonded to each other at the bonding surface of both the substrates.

The RFIC is connected to the lower surface of the second dielectric substrate 162. Thus, the antenna module 100 including the radiation electrode 120 and the ground electrode GND is constituted.

As described above, in the manufacturing process of FIG. 4, the first dielectric substrate 161, in which the radiation electrode 120 is disposed and the recesses 15 are formed in advance at the locations orthogonal to the radiation electrode 120 in the lamination direction, and the second dielectric substrate 162, in which the ground electrodes GND are disposed, are bonded by the bonding material 50, whereby the dielectric substrate 160, in which the cavities 20 are formed between the radiation electrode 120 and the ground electrodes GND, may be obtained.

According to the manufacturing process of the present disclosure described above, by bonding the first dielectric substrate 161, in which the recesses 15 are formed in advance, and the second dielectric substrate 162 with the bonding material 50, the dielectric substrate 160, in which hollow spaces are formed, may be manufactured. Accordingly, in the manufacturing process, a step of causing a portion corresponding to the hollow space to be filled with a paste in order to prevent deformation of the hollow space is unnecessary.

The manufacturing process includes a first firing step of firing each of the first dielectric substrate 161 and the second dielectric substrate 162, and a second step of performing firing again after arranging the first dielectric substrate 161 and the second dielectric substrate 162 with the bonding material 50 interposed therebetween. However, the present disclosure is not limited thereto.

For example, the first dielectric substrate 161 before firing and the second dielectric substrate 162 before firing may be arranged with the bonding material 50 interposed therebetween, and then the substrates and the bonding material 50 may be sintered in one firing step. The bonding material 50 used at this time is, for example, a metal paste. However, other types of pastes may be used as long as they are other than the ceramic that is used as the material of the first dielectric substrate 161 and the second dielectric substrate 162.

The smaller the number of firing steps, the more time and labor for firing may be saved. On the other hand, in the case where the step of bonding the fired dielectric substrates to each other is employed, the degree of freedom in designing the structure of the recess 15 is increased. This is because the shape of the recess 15 is more stable in the fired dielectric substrate than in the dielectric substrate before firing, which makes it unnecessary to consider the possibility of deformation of the recess 15 when bonding the two dielectric substrates.

Therefore, when the step of bonding the fired dielectric substrates to each other is adopted, the cavity 20 having a large size may be provided in the dielectric substrate in a shape as designed. In addition, when the step of bonding the fired dielectric substrates to each other is adopted, for example, a resin adhesive which does not require a sintering step for exhibiting the adhesion effect may be used as the bonding material 50.

Variation 1

Figure 5:
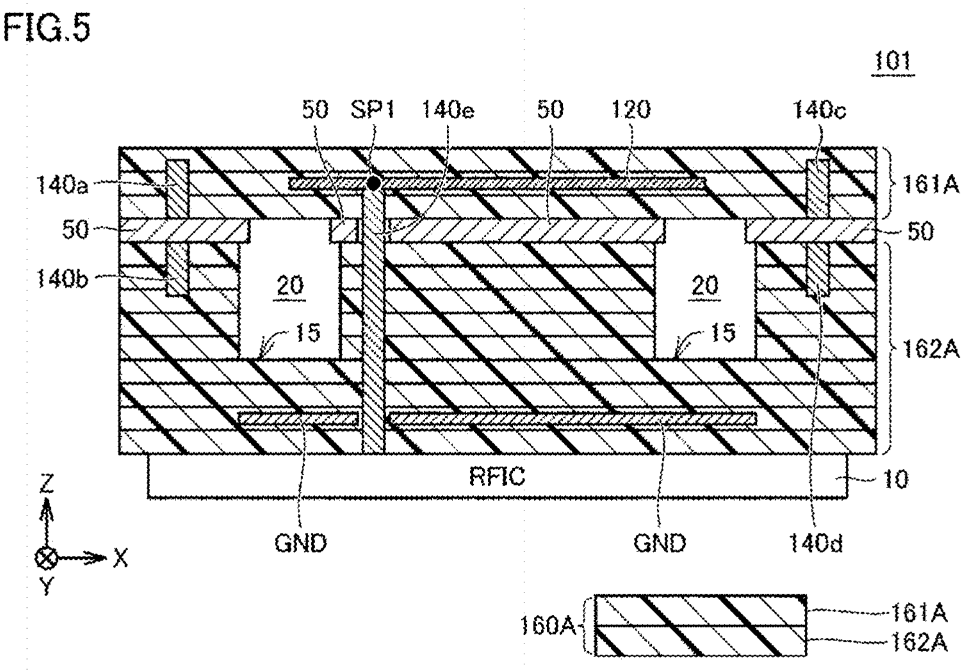
FIG. 5 is a transparent side view of an antenna module of Variation 1.

FIG. 5 is a transparent side view of an antenna module 101 of Variation 1. The antenna module 101 of Variation 1 is different from the antenna module 100 in a point that a recess 15 is formed not in a first dielectric substrate 161A but in a second dielectric substrate 162A. In other points, the antenna module 101 and the antenna module 100 have the same configuration. In a manufacturing process of the antenna module 101, after the first dielectric substrate 161A is disposed upside down with respect to the arrangement in FIG. 4, a bonding material 50 is applied to the first dielectric substrate 161A, and then the second dielectric substrate 162A may be disposed on the bonding material 50 in a state in which the recess 15 faces downward. Thus, a dielectric substrate 160A is constituted.

Variation 2

Figure 6:
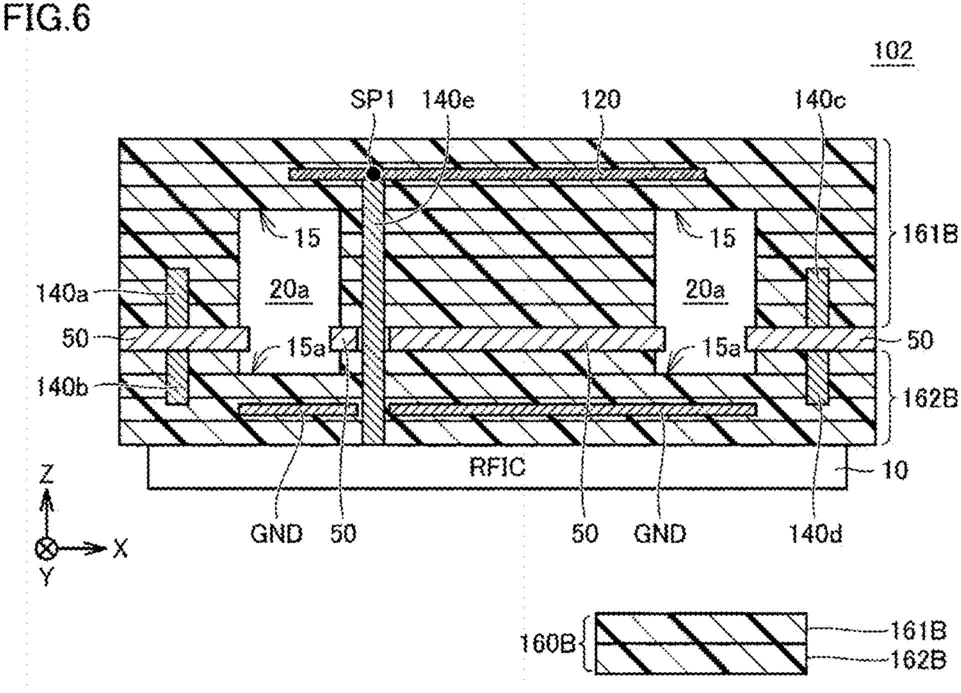
FIG. 6 is a transparent side view of an antenna module of Variation 2.

FIG. 6 is a transparent side view of an antenna module 102 of Variation 2. The antenna module 102 of Variation 2 is different from the antenna module 100 in a point that a recess 15*a* is additionally formed in a second dielectric substrate 162B. In other points, the antenna module 102 and the antenna module 100 have the same configuration. In a manufacturing process of the antenna module 102, a first dielectric substrate 161B is superimposed on the second dielectric substrate 162B while interposing a bonding material 50 so that a recess 15 formed in the first dielectric substrate 161B is positioned along the recess 15*a* formed in the second dielectric substrate 162B. Thus, a dielectric substrate 160B is constituted.

The recess 15 and the recess 15*a* may have different sizes, and may overlap each other with the X axis positions and Y axis positions thereof shifted from each other. The cavity is the first cavity, and a second cavity may be formed by the positions of the recess 15 and recess 15*a* being shifted from each other without overlapping on the X axis or the Y axis.

A cavity 20*a* formed in the dielectric substrate 160B of the antenna module 102 has a size deeper in the Z-axis direction in the drawing than the cavity 20 formed in the dielectric substrate 160 of the antenna module 100. For this reason, the antenna module 102 may more reduce the effective dielectric constant between two electrodes 120 and GND than the antenna module 100.

Variation 3

Figure 7:
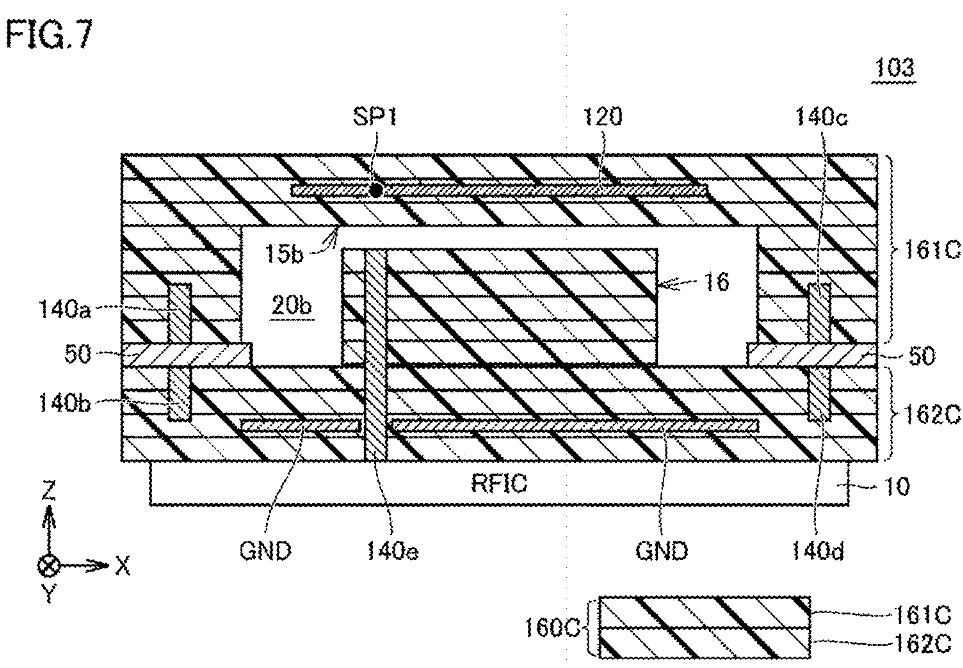
FIG. 7 is a transparent side view of an antenna module of Variation 3.

FIG. 7 is a transparent side view of an antenna module 103 of Variation 3. The antenna module 103 of Variation 3 is different from the antenna module 100 in that a feed point SP1 of a radiation electrode 120 and a via 140*e* connected to an RFIC 10 are separated by a cavity 20*b*. Power is fed by capacitive coupling between the feed point SP1 and the via 140*e*.

A recess 15*b* formed in a first dielectric substrate 161C extends from a position under one side of the radiation electrode 120 to a position under the other side thereof, the one side and the other side of the radiation electrode 120 opposing each other. A protrusion 16 is formed on a second dielectric substrate 162C. The via 140*e* is formed in the protrusion 16. By the first dielectric substrate 161C and the second dielectric substrate 162C being superimposed, a dielectric substrate 160C is constituted.

According to the antenna module 103 of Variation 3, since power is fed by capacitive coupling between the feed point SP1 and the via 140*e*, a connection failure of a feeder can be prevented as compared with a case where the feed point SP1 and the via 140*e* are connected by the feeder.

The cavity 20*b* of the antenna module 103 includes a space between the protrusion 16 and the recess 15*b*, and forms a space extending from a position under one side of the radiation electrode 120 to a position under the other side thereof. In the case of a configuration in which there is no space between the protrusion 16 and the recess 15*b* and the protrusion 16 is in contact with the recess 15*b*, the strength of the bonding portion between the protrusion 16 and the recess 15*b* is lowered due to aged deterioration brought about by temperature deviation in a day, whereby the product reliability life of the antenna module may be reduced. Since the cavity 20*b* including the space between the protrusion 16 and the recess 15*b* is formed in the antenna module 103, it is possible to prevent the product reliability life from being reduced due to the causes discussed above.

Variation 4

Figure 8:
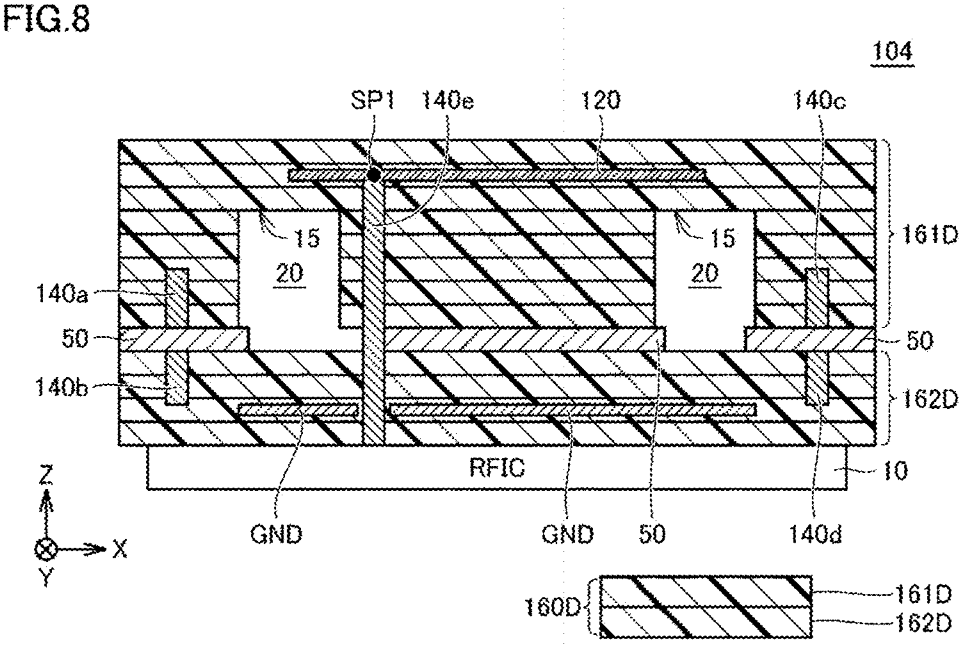
FIG. 8 is a transparent side view of an antenna module of Variation 4.

FIG. 8 is a transparent side view of an antenna module 104 of Variation 4. In the antenna module 104 of Variation 4, a bonding material 50 for bonding a first dielectric substrate 161D and a second dielectric substrate 162D is in contact with part of a via 140*e*. The positional relationship between the feed via 140*e* and the bonding material 50 is not particularly mentioned in Variations 1 to 3; Variation 4 is different from Variations 1 to 3 in that the bonding material 50 is a conductive member and the feed via 140*e* and the bonding material 50 are electrically connected to each other. By the first dielectric substrate 161D and the second dielectric substrate 162D being superimposed, a dielectric substrate 160D is constituted. In the antenna module 104, the bonding material 50 for bonding the first dielectric substrate 161D and the second dielectric substrate 162D is partially used as a stub.

The extent to which the bonding material 50 constituting the stub extends into a cavity 20, or the shape of the bonding material 50 constituting the sub may be appropriately adjusted in accordance with the need for impedance matching.

Variation 5

Figure 9:
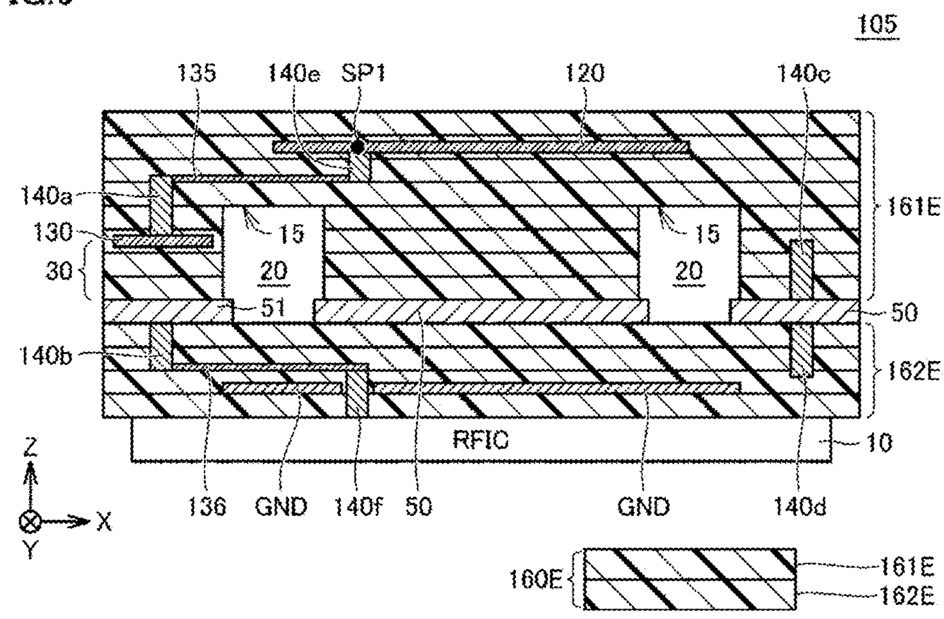
FIG. 9 is a transparent side view of an antenna module of Variation 5.

FIG. 9 is a transparent side view of an antenna module 105 of Variation 5. The antenna module 105 of Variation 5 includes a dielectric substrate 160E. The dielectric substrate 160E is constituted by a first dielectric substrate 161E and a second dielectric substrate 162E being superimposed. In the antenna module 105, a bonding material 51 functions as part of a matching circuit of the antenna.

The bonding material 51 is a conductive member. The bonding material 51 functions as an electrode. An electrode 130 is provided at a position facing the bonding material 51 in the Z-axis direction. Since a portion between the electrode 130 and the bonding material 51 is filled with a dielectric constituting the first dielectric substrate 161E, a capacitor 30 is formed by the electrode 130, the bonding material 51, and the dielectric. That is, in the antenna module 105, the bonding material 51 serves as an electrode constituting the capacitor 30.

The electrode 130 is electrically connected to a radiation electrode 120 through a via 140*a*, a via 140*e*, and a transmission line 135 connected to both the vias 140*a* and 140*e*. Meanwhile, the bonding material 51 is electrically connected to an RFIC 10 through a via 140*b*, a transmission line 136, and a via 140*f*. The bonding material 51, the electrode

130, the transmission lines 135 and 136, and the dielectric filling the portion between the bonding material 51 and the electrode 130 constitute a matching circuit of the antenna.

The electrode 130 illustrated in FIG. 9 is an example of a first conductive member. The electrode 130 is provided at a location facing the bonding material 51 positioned on a bonding surface between the first dielectric substrate 161E and the second dielectric substrate 162E.

According to Variation 5, the bonding material 51 is made to function as part of the matching circuit of the antenna to adjust the impedance, thereby making it possible to enhance the degree of freedom in circuit design. A circuit such as a matching circuit may be added by forming a circuit pattern on the surface layer of the bonding surface between the first dielectric substrate 161E and the second dielectric substrate 162E, mounting a component in the cavity 20, or the like.

In the antenna module 105, a bonding material 50 for bonding the first dielectric substrate 161E and the second dielectric substrate 162E may be the same conductive member as that of the bonding material 51 or may be a different member.

The capacitor 30 constituted by the electrode 130, the bonding material 51, and the dielectric may be provided midway in a via linearly formed from the radiation electrode 120 toward the RFIC 10. To be specific, the vias 140*a*, 140*b*, 140*e*, and 140*f* may be formed in the regions overlapping the radiation electrode 120 in a plan view. By doing so, the path length from the radiation electrode 120 to the RFIC 10 may be shortened, thereby improving the antenna characteristics.

Variation 6

Figure 10:
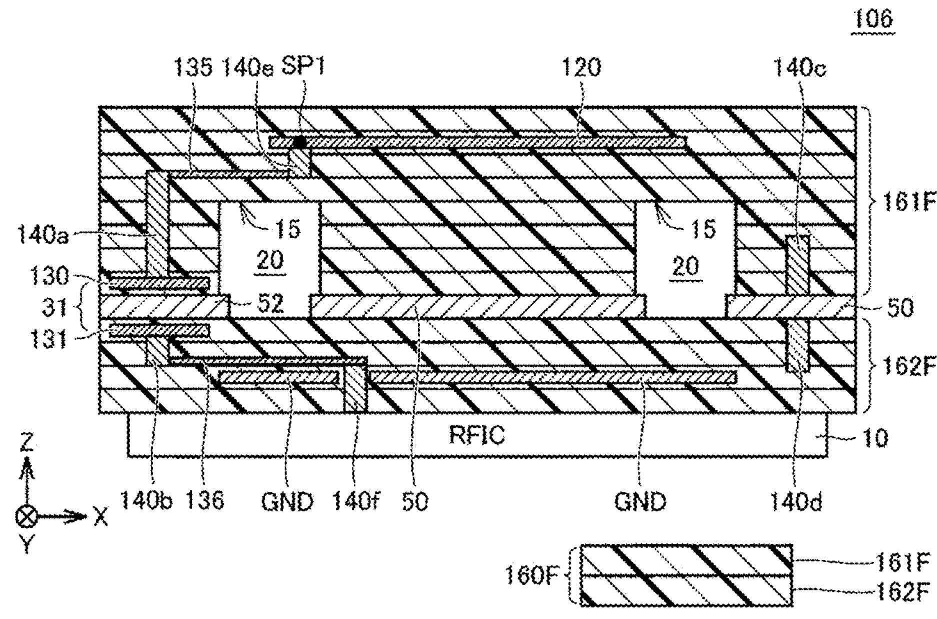
FIG. 10 is a transparent side view of an antenna module of Variation 6.

FIG. 10 is a transparent side view of an antenna module 106 of Variation 6. The antenna module 106 of Variation 6 includes a dielectric substrate 160F. The dielectric substrate 160F is constituted by a first dielectric substrate 161F and a second dielectric substrate 162F being superimposed. In the antenna module 106, as in the antenna module 105, a bonding material 52 functions as part of a matching circuit of the antenna. Note that in the antenna module 106, the bonding material 52 serves as a dielectric that constitutes a capacitor.

The bonding material 52 is a non-conductive member. The bonding material 52 functions as a dielectric. An electrode 130 and an electrode 131 are provided in the form of sandwiching the bonding material 52 therebetween at the positions facing the bonding material 52 in the Z-axis direction. Since a portion between the electrode 130 and the electrode 131 is filled with a dielectric formed by the bonding material 52, a capacitor 31 is formed by the electrode 130, the electrode 131, and the bonding material 52.

The electrode 130 is electrically connected to a radiation electrode 120 through a via 140*a*, a via 140*e*, and a transmission line 135 connected to both the vias 140*a* and 140*e*. On the other hand, a via 140*b* filled with a conductive member is connected to the electrodes 131. The bonding material 52, the electrodes 130 and 131, the via 140*b*, the transmission line 135, and a transmission line 136 constitute a matching circuit of the antenna.

The electrode 130 illustrated in FIG. 10 is an example of a second conductive member. The electrode 130 is provided at a location facing the bonding material 52 positioned on a bonding surface between the first dielectric substrate 161F and the second dielectric substrate 162F. The electrode 131 illustrated in FIG. 10 is an example of a third conductive member. The electrode 131 is provided at a location facing the electrode 130 serving as an example of the second conductive member with the bonding material 52 interposed therebetween.

According to Variation 6, the bonding material 52 is made to function as part of the matching circuit of the antenna to adjust the impedance, thereby making it possible to enhance the degree of freedom in circuit design. As in Variation 5, a circuit such as a matching circuit may be added by forming a circuit pattern on the surface layer of the bonding surface between the first dielectric substrate 161F and the second dielectric substrate 162F, mounting a component in a cavity 20, or the like.

In the antenna module 106, a bonding material 50 for bonding the first dielectric substrate 161F and the second dielectric substrate 162F may be the same non-conductive member as that of the bonding material 52 or may be a different member.

The capacitor 31 constituted by the electrode 130, the electrode 131, and the bonding material 52 may be provided midway in a via linearly formed from the radiation electrode 120 toward an RFIC 10. To be specific, instead of the vias 140*a*, 140*b*, and 140*e*, a first electrode is provided under a feed point SP1 in FIG. 10, and then a first via is formed between the feed point SP1 and the first electrode. A second electrode is further provided under the first electrode across a multilayer body of the substrate. Since the multilayer body present between the first electrode and the second electrode functions as a dielectric of a capacitor, the capacitor is constituted by the first electrode, the second electrode, and the multilayer body portion present between both the electrodes. In the second electrode, there is formed a second via extending from the second electrode toward the RFIC present below.

Variation 7

Figure 11:
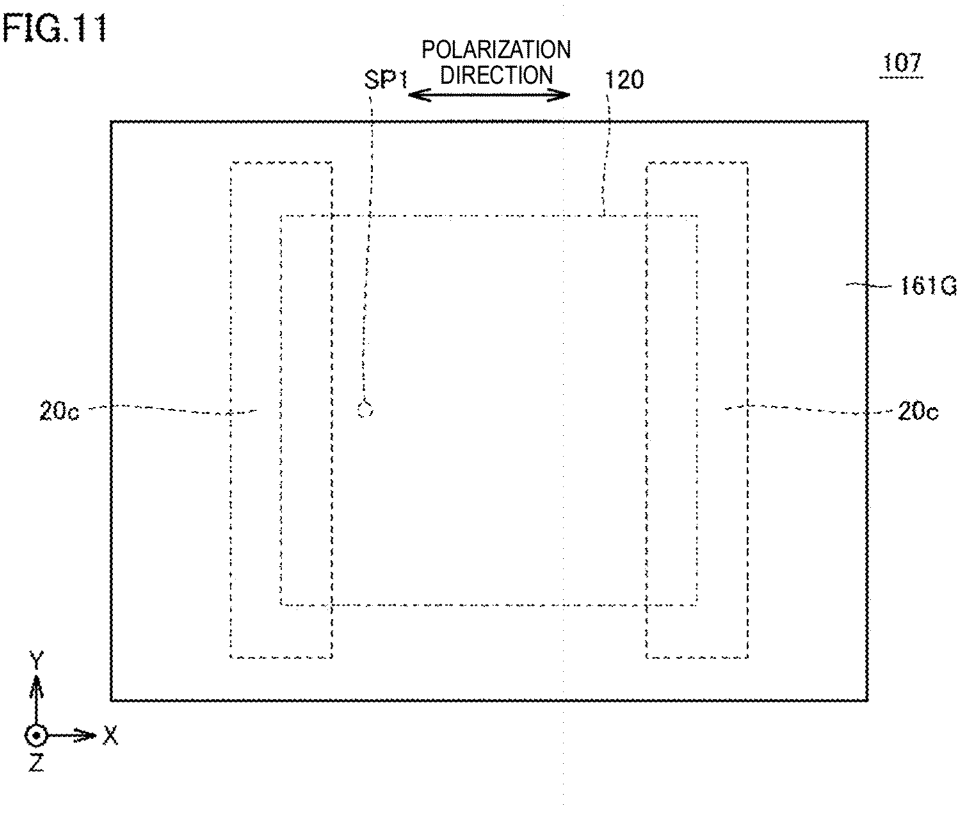
FIG. 11 is a transparent plan view of an antenna module of Variation 7.

FIG. 11 is a transparent plan view of an antenna module 107 of Variation 7. Similar to the antenna module 100, in the antenna module 107 of Variation 7, cavities 20*c* are formed at locations along two sides parallel to the Y-axis direction (the direction orthogonal to the polarization direction) among the four sides of a radiation electrode 120. Note that the cavities 20*c* formed in the antenna module 107 are each a cavity in which partition walls of the three cavities 20 formed in the antenna module 100 are removed to integrate the three cavities 20 into one cavity. The cavities 20*c* are formed in a first dielectric substrate 161G.

The cavities 20*c* of the antenna module 107 each have a larger space size arranged in the Y-axis direction than that of the cavity 20 of the antenna module 100, and thus an effect that the effective dielectric constant between the radiation electrode 120 and a ground electrode GND can be further reduced is exhibited. In addition, since the number of cavities to be formed is small compared to the antenna module 100, the manufacturing is easy to be carried out. On the other hand, as for the cavities 20 of the antenna module 100, because walls made of the first dielectric substrate 161 are present between the cavities 20, an effect that the strength of the substrate increases is exhibited, as compared to the cavities 20*c* of the antenna module 107.

Variation 8

Figure 12:
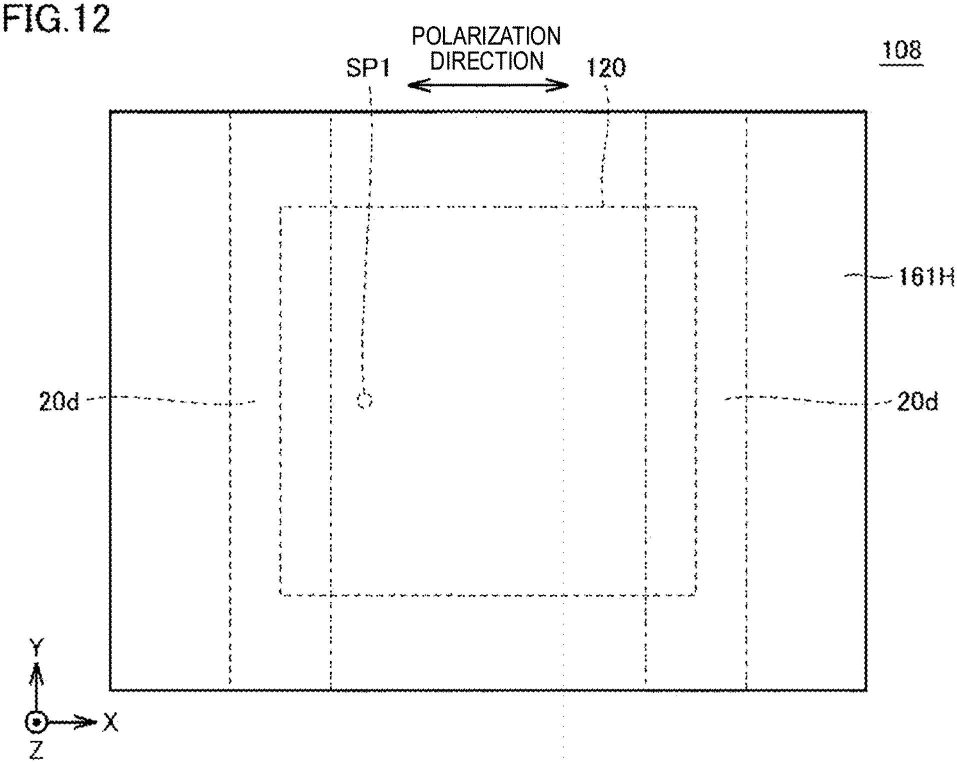
FIG. 12 is a transparent plan view of an antenna module of Variation 8.

FIG. 12 is a transparent plan view of an antenna module 108 of Variation 8. A cavity 20*d* of the antenna module 108 of Variation 8 is obtained by extending the cavity 20*c* formed in the antenna module 107 of Variation 7 to the outside of a first dielectric substrate 161H. When the antenna module 108 is viewed from the Y-axis direction, spaces of two cavities 20*d* penetrate the antenna module 108.

In the antenna module 108, since the cavity 20*d* is open to the external space, when a manufacturing process in which the first dielectric substrate 161 and second dielectric substrate 162 before firing are fired together with the bonding material 50 is employed, it is unnecessary to consider the influence of expansion of air in the cavity 20*d*. On the other hand, since a wall for closing the cavity 20*c* is formed at an end portion of the substrate, the strength of the antenna module 107 is high compared to the antenna module 108.

Variation 9

Figure 13:
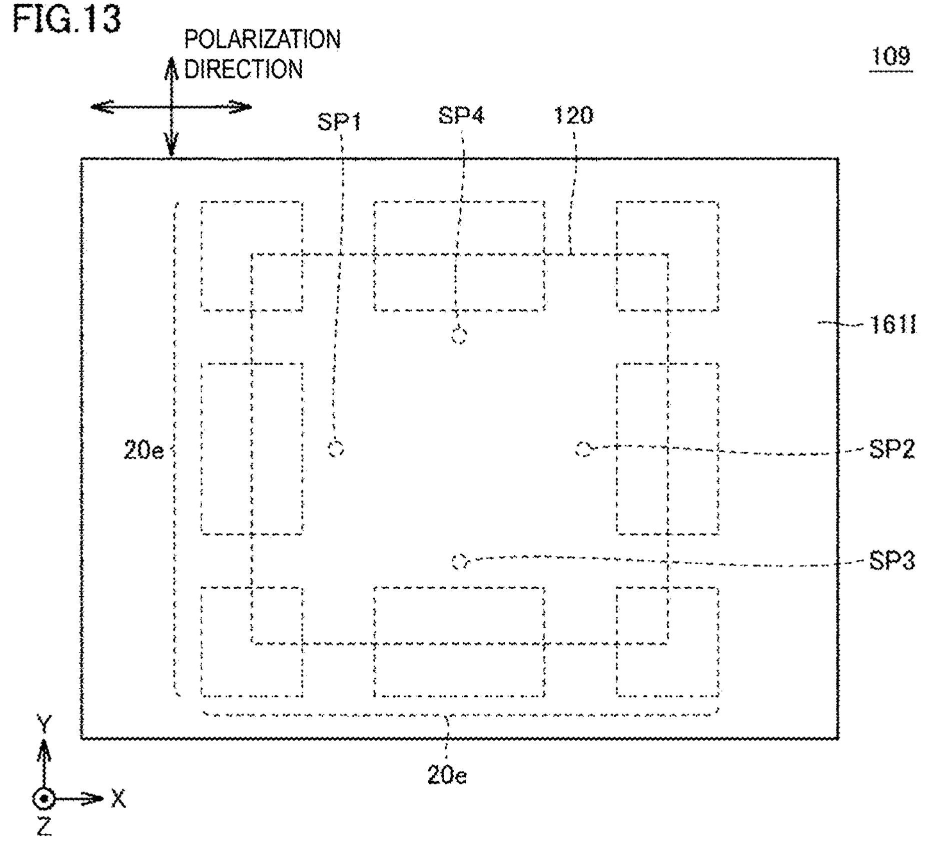
FIG. 13 is a transparent plan view of an antenna module of Variation 9.

FIG. 13 is a transparent plan view of an antenna module 109 of Variation 9. The antenna module 109 of Variation 9 employs a dual polarization feeding scheme including polarizations in both the X-axis and Y-axis directions, and is provided with four feed points. SP1 indicates a feed point disposed at a position offset in the negative X-axis direction. SP2 indicates a feed point disposed at a position offset in the positive X-axis direction. SP3 indicates a feed point disposed at a position offset in the negative Y-axis direction. SP4 indicates a feed point disposed at a position offset in the positive Y-axis direction.

In a first dielectric substrate 161I constituting part of the antenna module 109, a cavity 20*e* corresponding to a direction orthogonal to a polarization direction along the X-axis direction and a cavity 20*e* corresponding to a direction orthogonal to a polarization direction along the Y-axis are respectively formed. In the antenna module 109 illustrated in FIG. 13, no cavity 20*e* is formed in the vicinity of the center of a radiation electrode 120. However, the cavity 20*e* may also be formed in the vicinity of the center of the radiation electrode 120.

In this case, the arrangement of the cavities 20*e* corresponds to "cavity structure 1" in FIG. 2. As described above, the density of the lines of electric force between the radiation electrode and the ground electrode is highest at an electrode end of the radiation electrode orthogonal to the polarization direction of the radio wave. Therefore, it is considered that the degree of contribution to the antenna performance of the cavity disposed at a position not having a close relationship with the polarization direction of the radio wave is low. Because of this, in consideration of enhancement of the strength of the substrate, it is desirable that the cavity 20*e* is not provided in the vicinity of the center of the radiation electrode 120.

The antenna module 109 including four feed points has been described as an antenna module employing a dual polarization feeding scheme. Note that it is also possible to employ a dual polarization feeding scheme in an antenna module having two feed points instead of four feed points. For example, Variation 9 discussed above may be employed by an antenna module that employs a dual polarization feeding scheme including any of feed point combinations of (SP1, SP4), (SP1, SP3), (SP2, SP4), and (SP2, SP3).

Variation 10 to Variation 12

Figure 14:
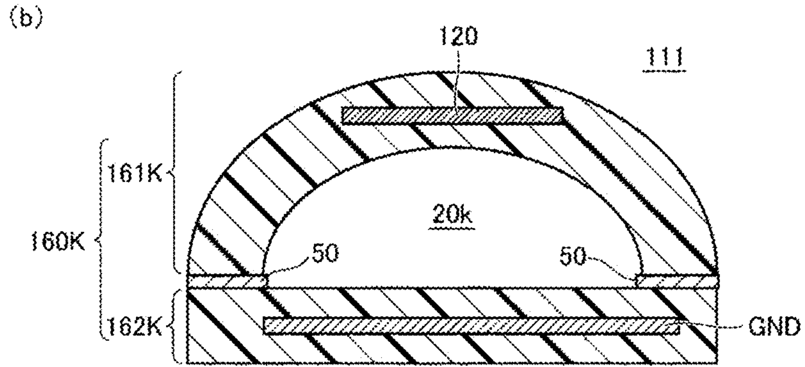
FIG. 14 includes diagrams illustrating antenna modules of Variations 10 to 12.
Figure 14:
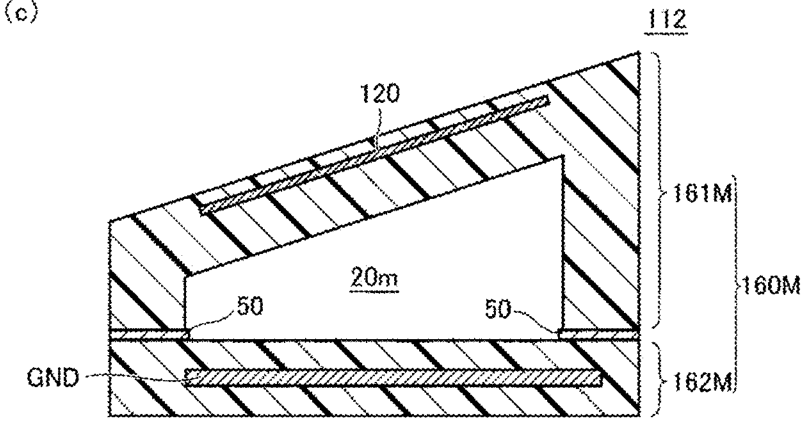

FIG. 14 includes diagrams illustrating antenna modules 110 to 112 of Variations 10 to 12, respectively. FIG. 14(*a*) illustrates a transparent plan view of an antenna module 110 of Variation 10. In a first dielectric substrate 161J constituting part of the antenna module 110, cavities 20*j* are respectively formed at positions corresponding to four corners of a radiation electrode 120 having a substantially rectangular shape. As illustrated in FIG. 14, part (a), when the antenna module 110 is seen through from above, the cavities 20*j* are formed in a lattice shape like a waffle.

FIG. 14 part (b) illustrates a transparent side view of the antenna module 111 of Variation 11. A dielectric substrate 160K constituting the antenna module 111 has a curved surface. The dielectric substrate 160K is configured of a first dielectric substrate 161K having a recess being cut out in a semicircular shape and a second dielectric substrate 162K. The two dielectric substrates 161K and 162K are bonded by a bonding material 50. A cavity 20*k* having a semicircular shape in a side view is formed in the dielectric substrate 160K. It is acceptable that the thickness of the first dielectric substrate 161K forming the cavity 20*k* is not uniform.

FIG. 14 part (c) illustrates a transparent side view of the antenna module 112 of Variation 12. A dielectric substrate 160M constituting the antenna module 112 is configured of a first dielectric substrate 161M and a second dielectric substrate 162M. The two dielectric substrates 161M and 162M are bonded by a bonding material 50.

When the dielectric substrate 160M is viewed from the side-surface side, thicknesses of one end and the other end of the first dielectric substrate 161M are different from each other. As a result, when the substrate front surface of the second dielectric substrate 162M is used as a reference, the substrate front surface of the first dielectric substrate 161M is inclined from the one end toward the other end. In the first dielectric substrate 161M, such a recess is formed that the depth of the cutout is different between the one end and the other end. By disposing the first dielectric substrate 161M on the second dielectric substrate 162M, a cavity 20*m* having a trapezoidal shape in a side view is formed in the dielectric substrate 160M. The radiation direction of beams may be set at a desired angle by physically inclining the substrate front surface of the first dielectric substrate 161M. It is also possible to adjust an angle of beams inclined in an unintended direction at the time of design.

As exemplified in FIG. 14 part (a) to 14 part (c), it is conceivable to provide cavities having various shapes as needed inside the dielectric substrate constituting the antenna module. For example, a three-dimensional (3D) printer may be used to form cavities having special shapes as depicted in FIG. 14 part (b) and 14 part (c). By using the 3D printer, a recess having a desired shape may be easily formed at the first dielectric substrate side.

The feeder of the antenna module 111 may extend from the dielectric layer of the second dielectric substrate 162K and connect to a radiation electrode 120 through the dielectric layer of the first dielectric substrate 161K, for example. Likewise, the feeder of the antenna module 112 may extend from the dielectric layer of the second dielectric substrate 162M and connect to a radiation electrode 120 through the dielectric layer of the first dielectric substrate 161M, for example.

Embodiment 2

In Embodiment 1, the dielectric substrate 160 is constituted by two substrates of the first dielectric substrate 161 and the second dielectric substrate 162. In Embodiment 2, an example will be described in which a third dielectric substrate 163N is used, in addition to two dielectric substrates 161N and 162N, to constitute a dielectric substrate 160N.

Figure 15:
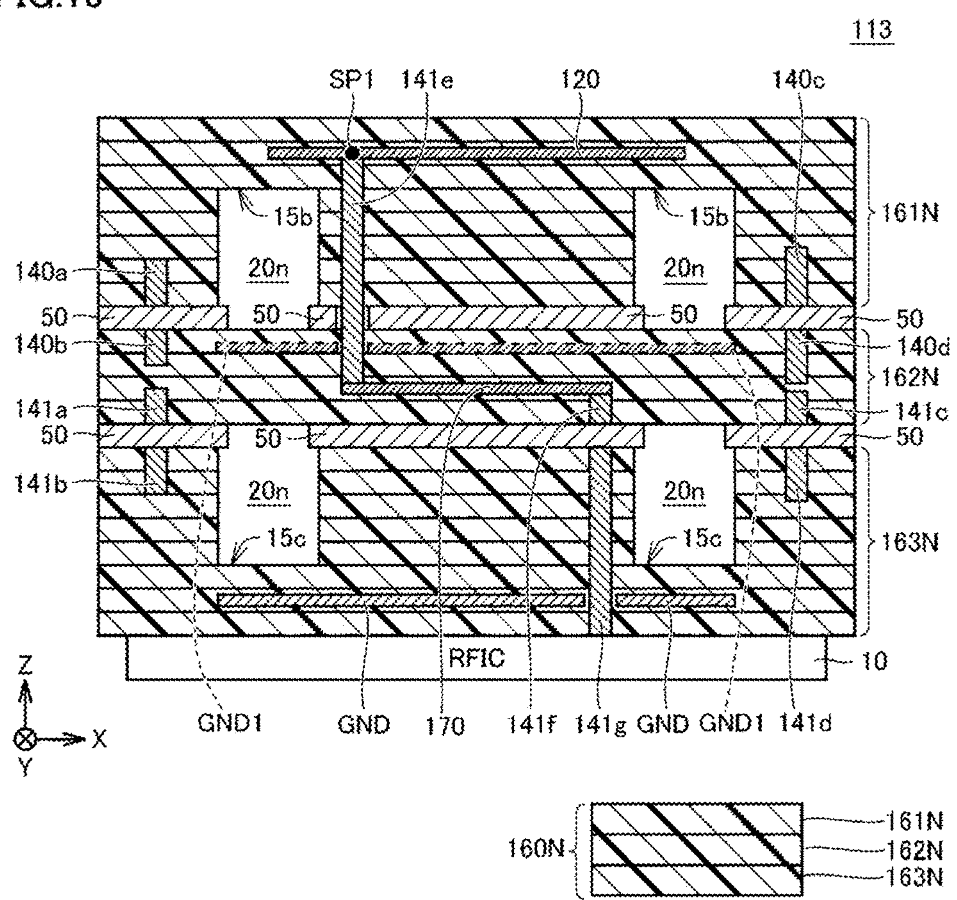
FIG. 15 is a transparent cross-sectional view of an antenna module according to Embodiment 2.

FIG. 15 is a transparent cross-sectional view of an antenna module 113 according to Embodiment 2. Referring to FIG. 15, the antenna module 113 includes the dielectric substrate 160N, a radiation electrode 120, a ground electrode GND, and an RFIC 10. The dielectric substrate 160N has a substantially rectangular shape when the antenna module 113 is seen in a plan view from the normal direction (the Z-axis direction in the drawing) of the dielectric substrate 160N.

As illustrated in FIG. 15, the dielectric substrate 160N has a structure in which the first dielectric substrate 161N, the second dielectric substrate 162N, and the third dielectric substrate 163N are laminated. The first dielectric substrate 161N, the second dielectric substrate 162N, and the third dielectric substrate 163N each have a multilayer structure in which a plurality of dielectric layers is laminated.

In the first dielectric substrate 161N, the radiation electrode 120 having a substantially rectangular shape is disposed. A filter electrode 170, which is an example of an electrode, is disposed in the second dielectric substrate 162N. The filter electrode 170 has a function of attenuating a signal in a specific frequency band. The ground electrode GND is disposed in the third dielectric substrate 163N.

The radiation electrode 120 and the filter electrode 170 are electrically connected to each other through a via 141*e*. The filter electrode 170 and the RFIC 10 are electrically connected to each other through vias 141*f* and 141*g*. As in Embodiment 1, a feed point SP1 is disposed at a position offset from the center of the radiation electrode 120 toward one of the two sides thereof parallel to the Y axis. Accordingly, a radio wave whose polarization direction takes the X-axis direction is radiated from the radiation electrode 120.

A recess 15*b* is formed in the first dielectric substrate 161N by cutting out part of the bottom surface in a direction toward the upper surface. The bottom surface of the first dielectric substrate 161N and the upper surface of the second dielectric substrate 162N are bonded by a bonding material 50. By bonding the first dielectric substrate 161N and the second dielectric substrate 162N to each other, a cavity 20*n* is formed between the two dielectric substrates 161N and 162N.

A recess 15*c* is formed in the third dielectric substrate 163N by cutting out part of the upper surface thereof. The bottom surface of the second dielectric substrate 162N and the upper surface of the third dielectric substrate 163N are bonded by the bonding material 50. By bonding the second dielectric substrate 162N and the third dielectric substrate 163N to each other, a cavity 20*n* is formed between the two dielectric substrates 162N and 163N.

In the portions of the bonding material 50 located at the bonding surface between the first dielectric substrate 161N and the second dielectric substrate 162N, vias 140*a* and 140*b*, and vias 140*c* and 140*d* are respectively formed in the form of passing through the bonding material 50 from the first dielectric substrate 161N toward the second dielectric substrate 162N, as in Embodiment 1.

Vias 141*a* and 141*b*, and vias 141*c* and 141*d* are also formed respectively in the portions of the bonding material 50 located at the bonding surface between the second dielectric substrate 162N and the third dielectric substrate 163N in the form of passing through the bonding material 50 from the second dielectric substrate 162N toward the third dielectric substrate 163N.

As in Embodiment 1, the vias 140*a* to 140*d*, and the vias 141*a* to 141*d* are provided like piles that are driven into the bonding material 50 and the dielectric substrates located above and below the bonding material 50. As a result, an effect that both the substrates are more firmly bonded to each other at the bonding surface thereof is exhibited.

In the antenna module 113 of Embodiment 2, the cavity 20*n* is formed between the radiation electrode 120 and the filter electrode 170. Furthermore, in the antenna module 113, the cavity 20*n* is formed between the filter electrode 170 and the ground electrode GND. In the antenna module 113, a plurality of the cavities 20*n* is formed between the radiation electrode 120 and the ground electrode GND in a laminated manner. The effective dielectric constant between the radiation electrode 120 and the ground electrode GND may be reduced by forming the above-described cavities 20*n*.

In the antenna module 113 of Embodiment 2, as in the antenna module 100 of Embodiment 1, the frequency bandwidth may be widened without increasing the size of the overall module.

An antenna circuit and a filter circuit are constituted by the antenna module 113 including the radiation electrode 120, the filter electrode 170, the ground electrode GND, and the RFIC 10. Further, an antenna circuit and a filter circuit are constituted by the antenna module 113 including the radiation electrode 120, the filter electrode 170, the ground electrodes GND, a ground electrode GND1, and the RFIC 10. The antenna circuit and the filter circuit are examples of a radio frequency circuit.

A manufacturing process of the antenna module 113 is similar to the manufacturing process of the antenna module 100. For example, the first dielectric substrate 161N and the second dielectric substrate 162N are arranged in the procedure represented by FIG. 4 part (1) to FIG. 4 part (4), and thereafter the third dielectric substrate 163N with the bonding material 50 applied to the upper surface portion thereof is arranged on the lower side of the second dielectric substrate 162N. Thereafter, the three dielectric substrates 161N to 163N are sintered to obtain the dielectric substrate 160N.

A recess may be provided at a location of the substrate front surface of the second dielectric substrate 162N facing the recess 15*c* formed in the third dielectric substrate 163N. This makes it possible to form a cavity deeper in the Z-axis direction than the cavity 20*n*, between the second dielectric substrate 162N and the third dielectric substrate 163N. Alternatively, a recess may be provided at a location of the substrate front surface of the second dielectric substrate 162N facing the recess 15*b* formed in the first dielectric substrate 161N. This makes it possible to form a cavity deeper in the Z-axis direction than the cavity 20*n*, between the first dielectric substrate 161N and the second dielectric substrate 162N.

As indicated by a broken line in FIG. 15, the ground electrode GND1 may be additionally provided between the radiation electrode 120 and the filter electrode 170. With this, the cavity 20*n* formed between the radiation electrode 120 and the ground electrode GND1 may function as a cavity for improving the antenna characteristics. Furthermore, the cavity 20*n* formed between the filter electrode 170 and the ground electrode GND may function as a cavity for improving the filter characteristics. The cavity 20*n* may be provided between an electrode end of the filter electrode 170 and the ground electrode in a plan view.

Embodiment 3

Figure 16:
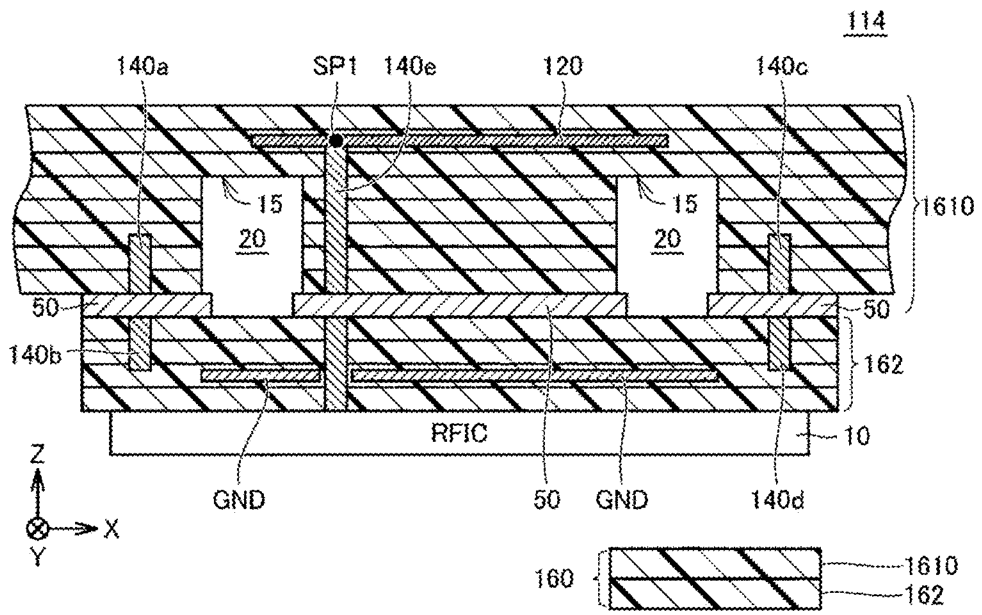
FIG. 16 is a transparent cross-sectional view of a communication device according to Embodiment 3.

FIG. 16 is a transparent cross-sectional view of a communication device 114 according to Embodiment 3. In Embodiment 1, the dielectric substrate 160 is constituted by two substrates of the first dielectric substrate 161 and the second dielectric substrate 162. In Embodiment 3, a housing 1610 of the communication device 114 constitutes a first dielectric substrate.

FIG. 16 illustrates only a portion of the housing 1610 of the communication device 114 to which a second dielectric substrate 162 is bonded. As illustrated in FIG. 16, the second dielectric substrate 162 is bonded to the inside of the housing 1610 with a bonding material 50 interposed therebetween. The bonding material may be a conductive member or a non-conductive member.

The material of the dielectric substrate, the type of the bonding material 50, and the like of the antenna module 100 described as Embodiment 1 are also applicable to Embodiment 2 and Embodiment 3. Further, Variations 1 to 12 of Embodiment 1 are also applicable to Embodiment 2 and Embodiment 3.

Hereinafter, other variations common to Embodiments 1 to 3 will be described.

In Embodiment 1, the radiation electrode 120 and the ground electrode GND are described as an example of the two electrodes. However, a filter electrode may be employed as the electrode. For example, as long as at least a filter electrode and a ground electrode are provided, the effective dielectric constant may be lowered to improve the characteristics of the circuit.

A single polarization feeding scheme configured by only the feed points SP1 and SP2 among the four feed points illustrated in FIG. 13 may be employed with regard to the antenna modules 100, 107, and 108 illustrated in FIGS. 1, 11, and 12 respectively. In the case where such a single polarization feeding scheme is employed in the antenna modules 100, 107, and 108 illustrated in FIGS. 1, 11, and 12 respectively, the phase of a radio frequency signal supplied to the feed point SP1 and the phase of a radio frequency signal supplied to the feed point SP2 are made opposite to each other.

The first dielectric substrate 161 and the second dielectric substrate 162 may be formed of the same material, or may be formed of different materials. The same applies to the relationship among the first dielectric substrate 161N, the second dielectric substrate 162N, and the third dielectric substrate 163N. For example, in a case where a patch antenna is provided in the first dielectric substrate 161(N) and a filter is provided in the second dielectric substrate 162(N), or the like, because performances required for the respective dielectric substrates are different, appropriate substrate materials may be selected in accordance with the required performances.

For example, one of two types of LTCC having different glass component amounts contained in the ceramic may be used as the substrate material of the first dielectric substrate 161(N), and the other one may be used as the substrate material of the second dielectric substrate 162(N). Even in the same type of ceramic, when the content of glass is different, the shrinkage ratio of the substrate differs when the substrate is fired. Because of this, when the first dielectric substrate 161(N) formed of a first type of LTCC and the second dielectric substrate 162(N) formed of a second type of LTCC are laminated and then sintered in a common firing step, the difference in shrinkage ratio may affect the finish.

Accordingly, when the first dielectric substrate 161(N) and the second dielectric substrate 162(N) made of mutually different materials are bonded to each other with the bonding material 50, it is desirable that the step of sintering each of the first dielectric substrate 161(N) and the second dielectric substrate 162(N) is separated from the step of sintering the bonding material 50 for bonding the two substrates. Alternatively, when the first dielectric substrate 161(N) and the second dielectric substrate 162(N) made of mutually different materials are bonded to each other with the bonding material 50, a resin adhesive, solder, or the like that does not have to be sintered may be used as the bonding material 50.

A gap leading from the cavity 20(*n*) to the outside of the substrate may be formed at the bonding portion between the first dielectric substrate 161(N) and the second dielectric substrate 162(N). By forming such a gap, when the first dielectric substrate 161(N) and the second dielectric substrate 162(N) are sintered at the same time, the air expanded in the cavity 20(*n*) may be released to the outside. For example, it is conceivable to use an insulating varnish as the bonding material 50 for forming the gap. The varnish is a mixture of ceramic powder and an acrylic solvent.

The first dielectric substrate 161(N), the second dielectric substrate 162(N), and the third dielectric substrate 163N may be formed using a 3D printer. When the 3D printer is used, the recess can be easily formed, and therefore the degree of design freedom is increased. Thus, when the 3D printer is used, for example, the first dielectric substrates 161J, 161K, and 161M having various shapes depicted in FIG. 14 may be easily manufactured.

When the 3D printer is used, the entire dielectric substrate 160(N) may be produced at once without individually producing the first dielectric substrate 161(N), the second dielectric substrate 162(N), and the third dielectric substrate 163N. However, since the green sheet multilayer body before firing lacks stability in shape, there is a possibility that a portion constituting the top surface of the cavity 20(*n*) is deformed by its own weight. In addition, when the dielectric substrate 160(N) is fired in a state in which the cavity 20(*n*) is completely sealed, the air pressure inside the cavity 20(*n*) increases, and there arises a risk that the wall surface is deformed in the cavity 20(*n*) or a crack occurs in the wall surface.

Therefore, when the dielectric substrate 160 is produced by using the 3D printer, it is desirable that the first dielectric substrate 161 and the second dielectric substrate 162 are individually produced by the 3D printer and then the first dielectric substrate 161 and the second dielectric substrate 162 are laminated to produce the dielectric substrate 160. Likewise, when the dielectric substrate 160N is produced by using the 3D printer, it is desirable that the first dielectric substrate 161N, the second dielectric substrate 162N, and the third dielectric substrate 163N are individually produced by the 3D printer and then the first dielectric substrate 161N, the second dielectric substrate 162N, and the third dielectric substrate 163N are laminated to produce the dielectric substrate 160N.

Embodiment 4

Figure 17:
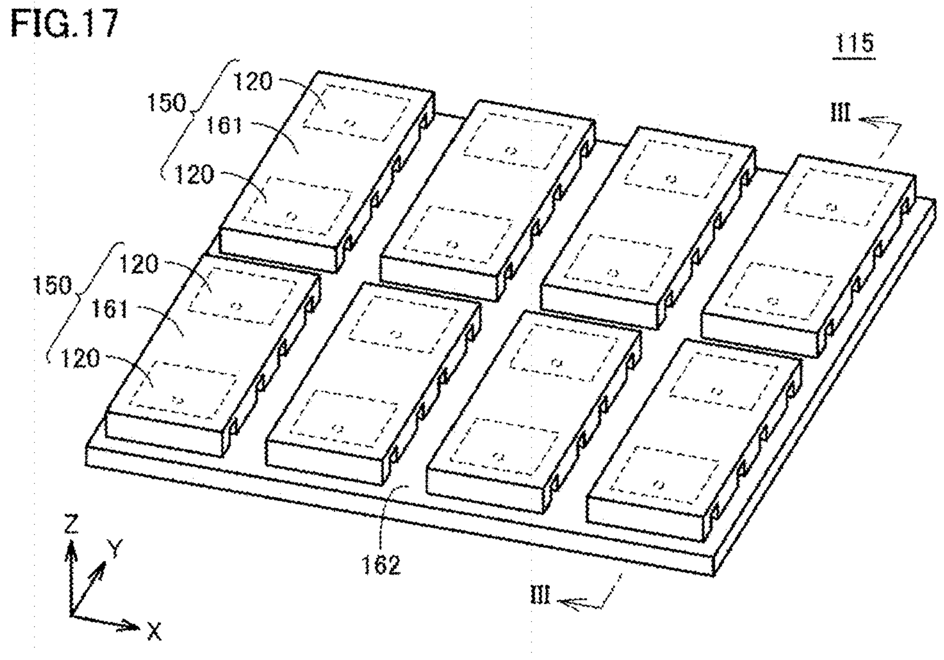
FIG. 17 is a perspective view of an antenna module according to Embodiment 4.

Embodiment 4 will be described with reference to FIGS. 17 and 18. FIG. 17 is a perspective view of an antenna module 115 according to Embodiment 4.

In an example illustrated in FIG. 17, eight array antennas 150 are disposed at predetermined intervals on the upper surface of a second dielectric substrate 162 constituting a main substrate.

Each array antenna 150 includes two radiation electrodes 120 and a first dielectric substrate 161 constituting a sub-substrate. The first dielectric substrate 161 is formed in a substantially rectangular shape having long sides in the Y-axis direction when seen in a plan view from the Z-axis direction. The two radiation electrodes 120 are disposed side by side in the Y-axis direction at a predetermined interval on the upper surface of the first dielectric substrate 161.

By mounting the eight array antennas 150 on the second dielectric substrate 162 as described above, the antenna module 115 is configured in such a manner that a total of 16 radiation electrodes 120 are arranged in a two-dimensional pattern of four by four.

Figure 18:
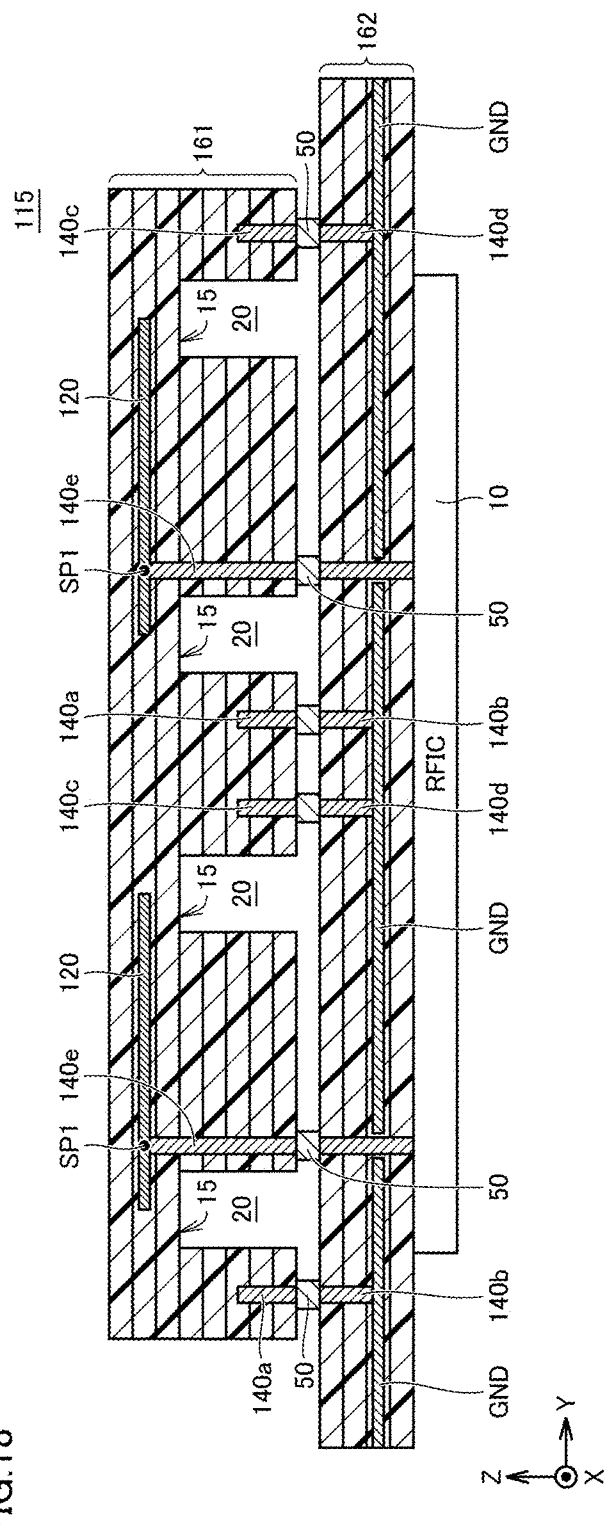
FIG. 18 is a cross-sectional view taken along a line III-III of the antenna module according to Embodiment 4.

FIG. 18 is a cross-sectional view taken along a line III-III of the antenna module 115 according to Embodiment 4. FIG. 18 illustrates a relationship between the second dielectric substrate 162 and one first dielectric substrate 161 among the eight first dielectric substrates 161.

The first dielectric substrate 161 constituting the sub-substrate is bonded to the second dielectric substrate 162 constituting the main substrate by a bonding material 50. A plurality of cavities 20 is formed between the first dielectric substrate 161 and the second dielectric substrate 162.

In Embodiment 4, the radiation electrode 120 may be exposed on the front surface of the first dielectric substrate 161. Further, for example, when the bonding material 50 is made of a conductive material such as solder, the bonding material 50 may be connected to a ground electrode GND or may be formed as a dummy electrode without being connected to the ground electrode GND.

Embodiment 5

Figure 19:
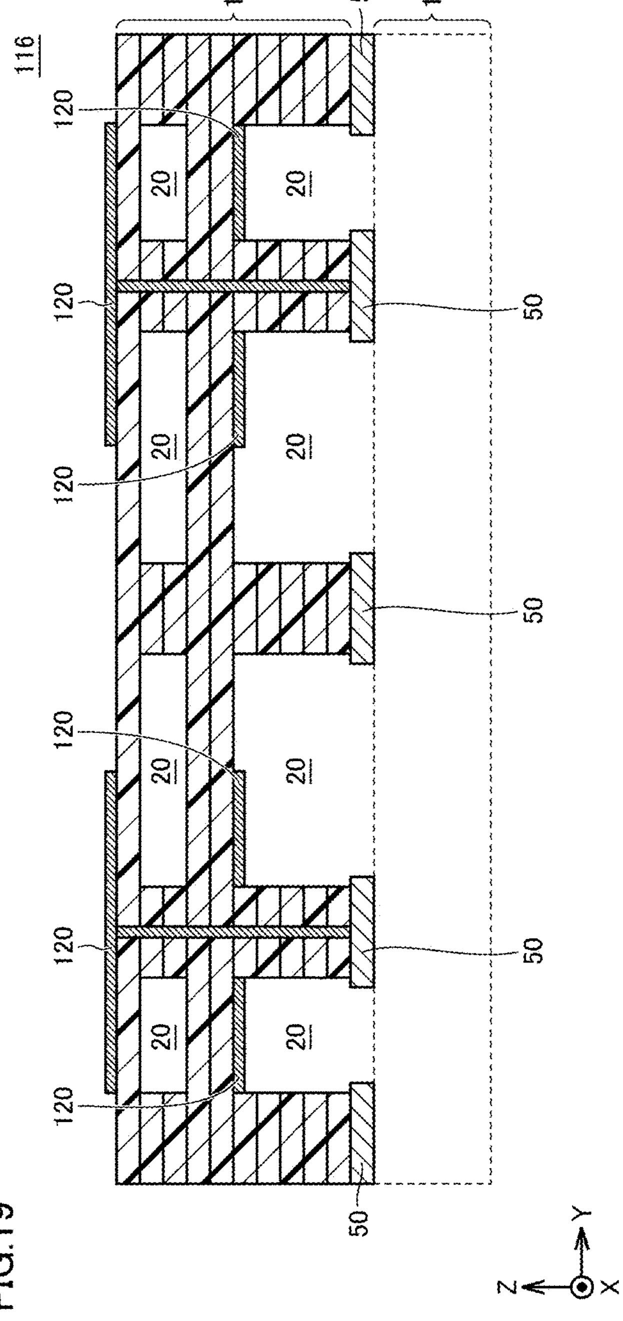
FIG. 19 is a transparent side view of an antenna module according to Embodiment 5.

Embodiment 5 will be described with reference to FIG. 19. FIG. 19 is a transparent side view of an antenna module 116 according to Embodiment 5. In the antenna module 116 according to Embodiment 5, a first dielectric substrate 161 and a second dielectric substrate 162 are bonded to each other by a bonding material 50.

The antenna module 116 constitutes a stacked patch antenna in which a plurality of radiation electrodes 120 is stacked. In the antenna module 116 related to Embodiment 5, two radiation electrodes 120 are arranged in the Z-axis direction, and the upper-side radiation electrode 120 is fed by a feeder passing through the lower-side radiation electrode 120. A plurality of cavities 20 is formed in the antenna module 116. In particular, in the antenna module 116 related to Embodiment 5, the cavities 20 are formed in two stages in the Z-axis direction. The first dielectric substrate 161 according to Embodiment 5 is constituted by a jungle gym-like structure, and a space is formed therein. Such structure may be formed by pouring a resin into a mold or may be formed by a 3D printer. It is conceivable to form the feeder by boring a hole in a support pole of the above-mentioned structure and pouring a copper paste into the hole or plating the hole.

Figure 20:
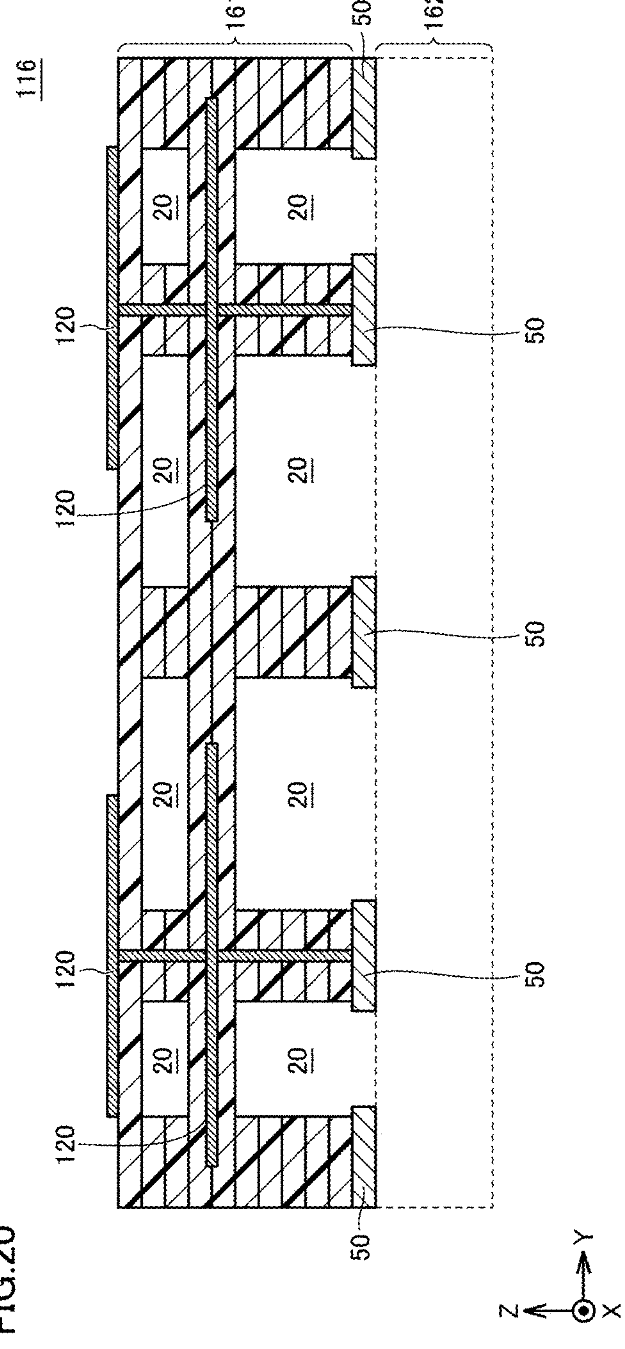
FIG. 20 is a diagram illustrating a variation of the antenna module according to Embodiment 5.

FIG. 20 is a diagram illustrating a variation of the antenna module according to Embodiment 5. The lower-side radiation electrode 120 illustrated in FIG. 19 may be located between cavities 20 of two stages as illustrated in FIG. 20. Further, for example, a radio wave radiated from an upper-side radiation electrode 120 and a radio wave radiated from the lower-side radiation electrode 120 may be different from each other, and a radio wave of 39 GHz band may be radiated from the upper-side radiation electrode 120 and a radio wave of 28 GHz band may be radiated from the lower-side radiation electrode 120. When a first dielectric substrate 161 and a second dielectric substrate 162 are viewed from above, it is allowed that the upper-side cavity 20 and the lower-side cavity 20 are not completely overlapped. For example, the lower-side cavity 20 may be larger than the upper-side cavity 20.

Figure 21:
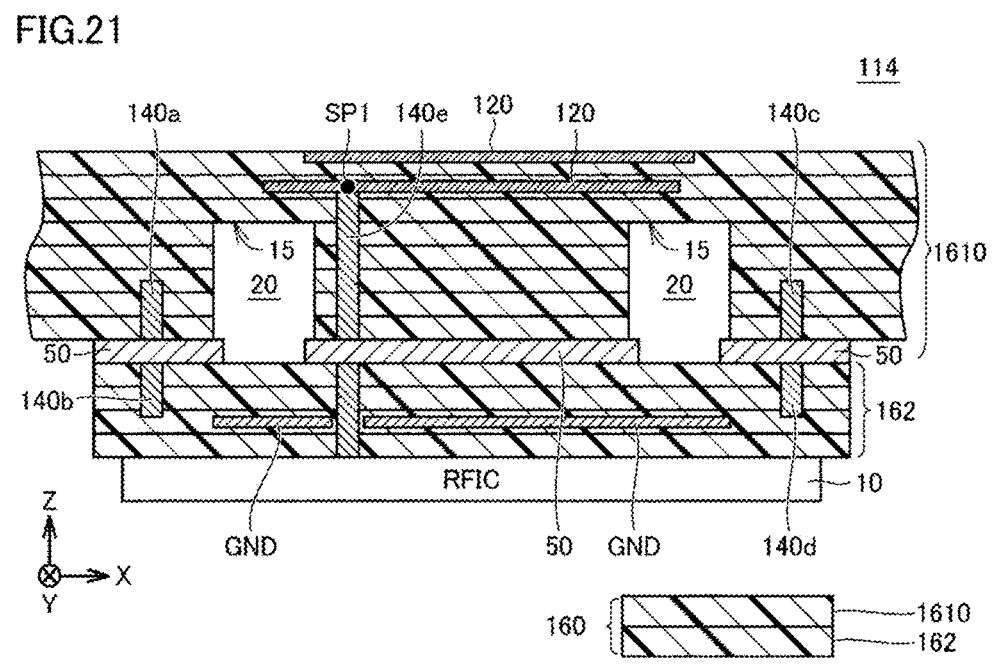

The stacked patch antenna described in Embodiment 5 is also applicable to Embodiments 1 to 4. For example, another radiation electrode may be disposed above the radiation electrode 120 of Embodiments 1 to 4. FIG. 21 is a diagram illustrating an example in which a radiation electrode 120 is additionally disposed above the radiation electrode 120 of Embodiment 3 illustrated in FIG. 16. The another radiation electrode is not limited to a feed element fed by a feeder, and may be a parasitic element excited by the radiation electrode 120 disposed below.

Features of Present Disclosure

Some features of the present disclosure will be listed below.

(A) A method for manufacturing a multilayer dielectric substrate (dielectric substrate 160) uses a first dielectric substrate (first dielectric substrate 161) having a multilayer structure in which a first electrode (radiation electrode 120) is disposed in a lamination direction and a first recess (recess 15) is formed at a location orthogonal to the first electrode in the lamination direction, and uses a second dielectric substrate (second dielectric substrate 162) having a multilayer structure in which a second electrode (ground electrode GND) is disposed in the lamination direction, the method including: a step of arranging the first dielectric substrate and the second dielectric substrate to cause the first recess to be present between the first electrode and the second electrode (arrangement in FIG. 4(4)); and a step of constituting a radio frequency circuit (antenna circuit) in which a first cavity (cavity 20) is formed between the first electrode and the second electrode by bonding the first dielectric substrate and the second dielectric substrate (firing in the arrangement of FIG. 4(4)).

(B) A multilayer dielectric substrate (Embodiment 1: dielectric substrate 160, Embodiment 2: dielectric substrate 160N) of the present disclosure includes: a first dielectric substrate (Embodiment 1: first dielectric substrate 161, Embodiment 2: third dielectric substrate 163N) having a multilayer structure in which a first electrode (Embodiment 1: radiation electrode 120, Embodiment 2: ground electrode GND) is disposed in a lamination direction and a first recess (Embodiment 1: recess 15, Embodiment 2: recess 15*c*) is formed at a location orthogonal to the first electrode in the lamination direction; and a second dielectric substrate (Embodiment 1: second dielectric substrate 162, Embodiment 2: second dielectric substrate 162N) having a multilayer structure in which a second electrode (Embodiment 1: ground electrode GND, Embodiment 2: filter electrode 170) is disposed in the lamination direction, wherein the first dielectric substrate and the second dielectric substrate are bonded in a state where the first recess is present between the first electrode and the second electrode to constitute a radio frequency circuit (Embodiment 1: antenna circuit, Embodiment 2: filter circuit) in which a first cavity (Embodiment 1: cavity 20, Embodiment 2: cavity 20*n*) is formed between the first electrode and the second electrode, and a material of a bonding material (bonding material 50) for bonding the first dielectric substrate and the second dielectric substrate (non-conductive paste other than LTCC, conductive paste) is different from a material (LTCC) of the first dielectric substrate and the second dielectric substrate.

(C) In the multilayer dielectric substrate (the dielectric substrate 160B in FIG. 6) of the present disclosure, the second dielectric substrate is provided with a second recess (15*a* in FIG. 6) formed at a location orthogonal to the second electrode in the lamination direction, and the first and second dielectric substrates are bonded to each other (the dielectric substrate 160B in FIG. 6) in a state where the first and second recesses are present between the first and second electrodes to constitute a radio frequency circuit (antenna circuit) in which the first cavity (20*a*) is formed by the first and second recesses between the first and second electrodes.

(D) The multilayer dielectric substrate (Embodiment 2: dielectric substrate 160N in FIG. 15) of the present disclosure further includes a third dielectric substrate (Embodiment 2: first dielectric substrate 161N) in which a third electrode (Embodiment 2: radiation electrode 120) is disposed in the lamination direction and a third recess (Embodiment 2: 15*b*) is formed at a location orthogonal to the third electrode in the lamination direction, wherein the second dielectric substrate (Embodiment 2: second dielectric substrate 162N) and the third dielectric substrate (Embodiment 2: first dielectric substrate 161N) are bonded to each other (Embodiment 2: dielectric substrate 160N in FIG. 15) in a state where the third recess is present between the first electrode (Embodiment 2: ground electrode GND) and the third electrode (Embodiment 2: radiation electrode 120) to form a third cavity (Embodiment 2: cavity 20*n*) between the first electrode and the third electrode.

It is to be understood that the embodiments disclosed herein are illustrative in all respects and are not restrictive. The scope of the present invention is defined not by the above description of the embodiments but by the claims, and is intended to include all modifications within the meaning and scope equivalent to the claims.

REFERENCE SIGNS LIST

10 RFIC
15, 15*a*, 15*b*, 15*c* RECESS
16 PROTRUSION
20, 20*a*, 20*b*, 20*c*, 20*d*, 20*e*, 20*j*, 20*k*, 20*m*, 20*n* CAVITY
30, 31 CAPACITOR
50, 51, 52 BONDING MATERIAL
100 to 113, 115, 116, 200, 300 ANTENNA MODULE
114 COMMUNICATION DEVICE
120 RADIATION ELECTRODE
130, 131 ELECTRODE
135, 136 TRANSMISSION LINE
140*a* to 140*e*, 141*a* to 141*g* VIA
150 ARRAY ANTENNA
160, 160A to 160F, 160K, 160M, 160N DIELECTRIC SUBSTRATE
161, 161A to 161K, 161M, 161N FIRST DIELECTRIC SUBSTRATE
162, 162A to 162F, 162K, 162M, 162N SECOND DIELECTRIC SUBSTRATE
163N THIRD DIELECTRIC SUBSTRATE
170 FILTER
1610 HOUSING
GND, GND1 GROUND ELECTRODE
SP1 to SP4 FEED POINT

The invention claimed is:

1. A method for manufacturing a multilayer dielectric substrate, the method comprising: arranging a first dielectric substrate having a first multilayer structure, the first multilayer structure including a plurality of laminated dielectric layers, at least one first electrode, and a first recess formed to extend through at least some of the plurality of laminated dielectric layers and to at least partially overlap the at least one first electrode in a lamination direction; arranging a second dielectric substrate having a second multilayer structure with a second electrode, so the first recess is positioned between the at least one first electrode and the second electrode;

and constituting at least a portion of a radio frequency circuit in which a first cavity is formed from the first recess being positioned between the at least one first electrode and the second electrode, the constituting including bonding the first dielectric substrate and the second dielectric substrate via a bonding material different from a material of the first dielectric substrate and the second dielectric substrate; wherein the at least one first electrode is a radiation electrode, the second electrode is a ground electrode, and a feed point of the radiation electrode is connected to a feeder inside a via extending in a lamination direction of the multilayer dielectric substrate, the via extending from the radiation electrode through the ground electrode to contact an RFIC on a bottom of the second dielectric substrate, the RFIC being external with respect to the second dielectric substrate.

2. The method for manufacturing the multilayer dielectric substrate according to claim 1, wherein the first dielectric substrate is one of a plurality of first dielectric sub-substrates arranged in a same plane, and the second dielectric substrate is a single dielectric substrate.

3. A multilayer dielectric substrate, comprising: a first dielectric substrate having a first multilayer structure, the first multilayer structure including a plurality of laminated dielectric layers, at least one first electrode, and a first recess extending through at least some of the plurality of laminated dielectric layers and positioned to at least partially overlap the at least one first electrode in a lamination direction; a second dielectric substrate having a second multilayer structure, the second multilayer structure including a plurality of laminated dielectric layers and a second electrode; and a bonding material that bonds the first dielectric substrate and the second dielectric substrate in a state where the first recess is present between the at least one first electrode and the second electrode so as to constitute at least a portion of a radio frequency circuit in which a first cavity that includes the first recess is between the at least one first electrode and the second electrode, wherein the bonding material is different from a material comprising the first dielectric substrate and the second dielectric substrate; wherein the at least one first electrode is a radiation electrode, the second electrode is a ground electrode, and a feed point of the radiation electrode is connected to a feeder inside a via extending in a lamination direction of the multilayer dielectric substrate, the via extending from the radiation electrode through the ground electrode to contact an RFIC on a bottom of the second dielectric substrate, the RFIC being external with respect to the second dielectric substrate.

4. The multilayer dielectric substrate according to claim 3, wherein the second dielectric substrate is provided with a second recess positioned to overlap the second electrode in the lamination direction, the first dielectric substrate and the second dielectric substrate are bonded to each other such that the first recess and the second recess are present between the at least one first electrode and the second electrode, the first cavity comprising the first recess and the second recess and positioned between the at least one first electrode and the second electrode.

5. The multilayer dielectric substrate according to claim 4, wherein the first dielectric substrate is one of a plurality of first dielectric sub-substrates arranged in a same plane, and the second dielectric substrate is a single dielectric substrate.

6. The multilayer dielectric substrate according to claim 4, further comprising:

a third dielectric substrate having a multilayer structure in which a third electrode is disposed and a third recess is formed at a position overlapping the third electrode in the lamination direction, wherein the second dielectric substrate and the third dielectric substrate are bonded to each other in a state where the third recess is present between the at least one first electrode and the third electrode to form a third cavity between the at least one first electrode and the third electrode.

7. The multilayer dielectric substrate according to claim 3, wherein the at least one first electrode further comprises a filter electrode.

8. The multilayer dielectric substrate according to claim 3, wherein the radiation electrode has a substantially rectangular shape, a feed point of the radiation electrode is disposed at a position offset from a center of the radiation electrode in a plan view of the first dielectric substrate, and the first recess extends along a side orthogonal to a polarization direction of a radio wave radiated from the radiation electrode and at a position overlapping an end portion of the radiation electrode in the plan view of the first dielectric substrate.

9. The multilayer dielectric substrate according to claim 3, wherein the bonding material comprises an electrically conductive material.

10. The multilayer dielectric substrate according to claim 9, further comprising:

a first conductive member that faces the bonding material located on a bonding surface between the first dielectric substrate and the second dielectric substrate with a dielectric layer of the multilayer dielectric substrate interposed between the bonding material and the first conductive member, wherein the bonding material, the first conductive member, and the dielectric layer interposed between the bonding material and the first conductive member constitute a first matching circuit.

11. The multilayer dielectric substrate according to claim 4, wherein the bonding material is non-conductive.

12. The multilayer dielectric substrate according to claim 11, further comprising:

a second conductive member that faces the bonding material on a bonding surface between the first dielectric substrate and the second dielectric substrate; and a third conductive member that faces the second conductive member with the bonding material interposed between the second conductive member and the third conductive member, wherein the second conductive member, the third conductive member, and the bonding material interposed between the second conductive member and the third conductive member constitute a second matching circuit.

13. The multilayer dielectric substrate according to claim 3, wherein;

the bonding material is a layer extending at least along an entire bottom of the first dielectric substrate, excluding the first cavity, and the first cavity is a closed space in the multilayer dielectric substrate.

14. The multilayer dielectric substrate according to claim 4, wherein the first cavity includes a portion opened to an outside of the multilayer dielectric substrate.

15. The multilayer dielectric substrate according to claim 3, wherein a part of the bonding material between the first dielectric substrate and the second dielectric substrate extends beyond a sidewall of the first recess and into the first recess.

16. The multilayer dielectric substrate according to claim 3, further comprising: a via filled with a member having conductivity that sandwiches the bonding material located on the bonding surface between the first dielectric substrate and the second dielectric substrate from a first dielectric substrate side and a second dielectric substrate side.

17. The multilayer dielectric substrate according to claim 4, wherein the first recess and other first recesses are formed in a lattice pattern in a plan view of the first dielectric substrate.

18. The multilayer dielectric substrate according to claim 4, wherein the first cavity has a trapezoidal shape as viewed from a side-surface side of the multilayer dielectric substrate.

* * * * *